US012159873B2

(12) United States Patent
Tsai et al.

(10) Patent No.: US 12,159,873 B2
(45) Date of Patent: Dec. 3, 2024

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Yung-Chih Tsai, Hsinchu County (TW); Chih-Ping Chao, Hsin-Chu (TW); Chun-Hung Chen, Hsinchu County (TW); Shaoqiang Zhang, Hsinchu (TW); Kuan-Liang Liu, Pingtung County (TW); Chun-Pei Wu, Nantou County (TW); Alexander Kalnitsky, San Francisco, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 297 days.

(21) Appl. No.: 17/353,436

(22) Filed: Jun. 21, 2021

(65) Prior Publication Data

US 2022/0406819 A1    Dec. 22, 2022

(51) Int. Cl.
*H01L 27/12* (2006.01)
*H01L 21/84* (2006.01)
*H01L 29/66* (2006.01)

(52) U.S. Cl.
CPC .......... *H01L 27/1207* (2013.01); *H01L 21/84* (2013.01); *H01L 29/66545* (2013.01)

(58) Field of Classification Search
CPC .............. H01L 27/1207; H01L 21/84; H01L 29/66545; H01L 29/66651
See application file for complete search history.

(56) References Cited

U.S. PATENT DOCUMENTS

| | | | | |
|---|---|---|---|---|
| 6,083,324 A * | 7/2000 | Henley | ............... | H01L 21/2007 257/E21.32 |
| 6,486,513 B1 * | 11/2002 | Matsumoto | ............. | H01L 21/84 257/349 |
| 2003/0104658 A1 * | 6/2003 | Furukawa | ........... | H01L 27/1207 257/E21.651 |
| 2009/0146760 A1 * | 6/2009 | Reefman | ............. | H01L 23/3128 333/184 |

* cited by examiner

*Primary Examiner* — Michelle Mandala
*Assistant Examiner* — Kevin Quinto
(74) *Attorney, Agent, or Firm* — WPAT LAW; Anthony King

(57) ABSTRACT

A method includes: receiving a composite substrate including a first region and a second region, the composite substrate comprising a semiconductor substrate and an insulator layer over the semiconductor substrate; bonding a silicon layer to the composite substrate; depositing a capping layer over the silicon layer; forming a trench through the capping layer, the silicon layer and the insulator layer, the trench exposing a surface of the semiconductor substrate in the first region; growing an initial epitaxial layer in the trench; removing the capping layer to form an epitaxial layer from the silicon layer and the initial epitaxial layer; forming a transistor layer over the epitaxial layer, the transistor layer including a first transistor and a second transistor in the first region and the second region, respectively; and forming an interconnect layer over the transistor layer and electrically coupling the first transistor to the second transistor.

20 Claims, 41 Drawing Sheets

SEMICONDUCTOR STRUCTURE AND MANUFACTURING METHOD THEREOF

BACKGROUND

The manufacturing of the semiconductor devices with an increased device density is becoming increasingly complicated. An increase in complexity of the manufacturing of the semiconductor device may result in deficiencies such as degraded electrical performance or other issues, resulting in a high yield loss of the semiconductor structure and an increase in manufacturing cost. As a result, with the expanded functionality and reduced footprint of the semiconductor device, materials and manufacturing methods of the semiconductor devices are getting more complicated for fulfill more challenging performance criteria and tolerance in the advanced technology nodes.

Various types of semiconductor devices, e.g., digital devices, analog devices and radio frequency devices, have been proven to be widely accepted by the semiconductor manufacturing industry. The radio frequency devices generally are formed on a silicon-on-insulator (SOI) substrate, while the digital or analog devices generally are formed on a silicon bulk substrate. Integrating the radio frequency devices with the digital or analog devices may lead to many advantages. However, there are still issues in integrating the different substrates. Therefore, there is a need to develop techniques to improve the performance of the integrated the bulk substrate and the SOI substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
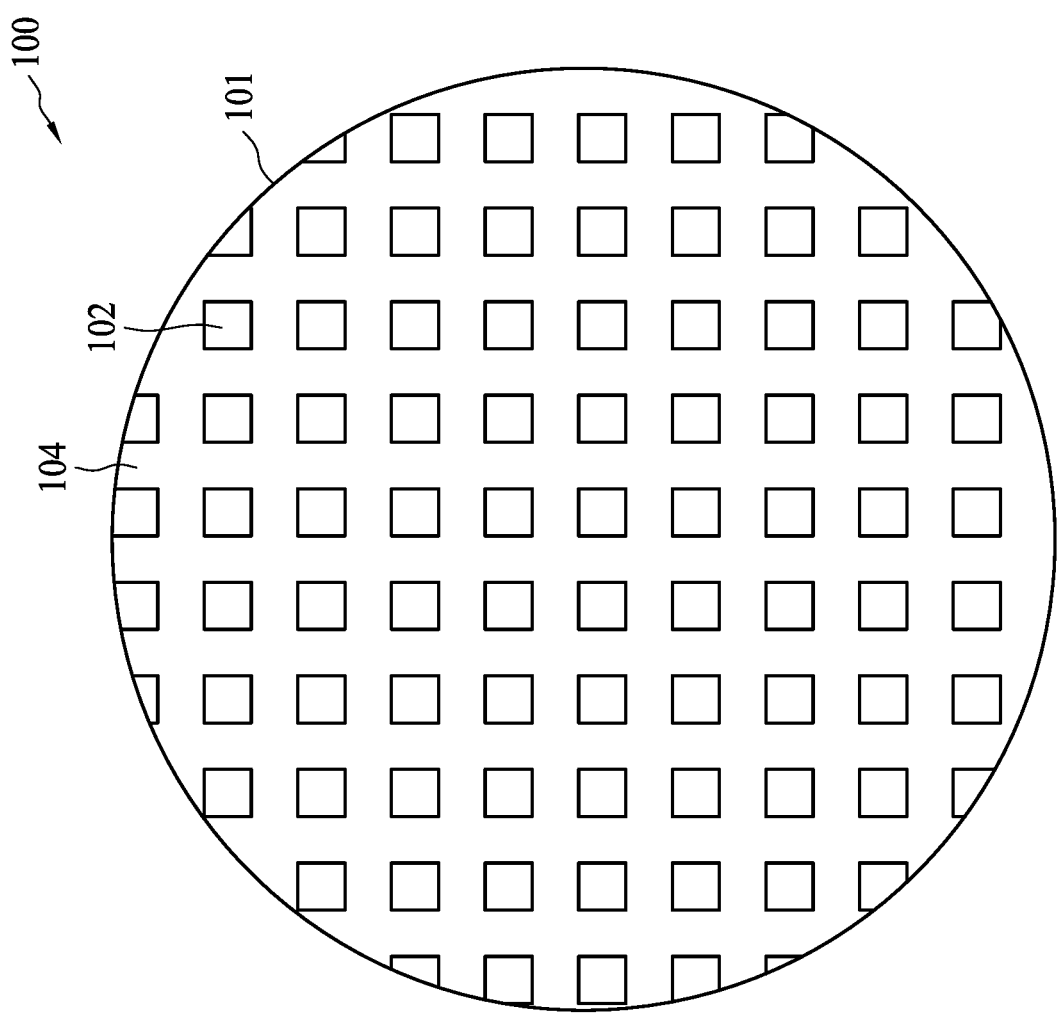
FIG. 1 is a schematic top view of a semiconductor wafer, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower." "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The terms "couple," "coupled" and "coupling" used throughout the present disclosure describe the direct or indirect connections between two or more devices or elements. In some cases, a coupling between at least two devices or elements refers to mere electrical or conductive connections between them and intervening features may be present between the coupled devices and elements. In some other cases, a coupling between at least two devices or elements may involve physical contact and/or electrical connections.

The present disclosure relates generally to a structure and a method associated with a hybrid substrate, and relates more particularly to a structure and a method for a hybrid substrate including one or more bulk silicon regions and one or more silicon-on-insulator (SOI) regions. Through the hybrid substrate, the radio frequency devices and the digital/analog devices can be formed on the SOI regions and the bulk silicon regions, respectively, of a single substrate. The cost and performance loss due to extra packaging and/or routing wires can be reduced accordingly. Therefore, the device performance is improved.

FIG. 1 is a schematic top view of a semiconductor wafer 100, in accordance with some embodiments of the present disclosure. The semiconductor wafer 100 may include several semiconductor devices 102 arranged in an array. During a semiconductor manufacturing process, the semiconductor wafer 100 may be held by a wafer holder or a chuck (not shown). The semiconductor wafer 100 includes a substrate 101. In some embodiments, the substrates 101 includes semiconductor material such as bulk silicon. In some embodiments, the substrate 101 includes other semiconductor materials, such as silicon germanium, silicon carbide, gallium arsenide, or the like. In some embodiments, the substrate 101 is a p-type semiconductive substrate (acceptor type) or an n-type semiconductive substrate (donor type). Alternatively, the substrate 101 includes another elementary semiconductor, such as germanium; a compound semiconductor including gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In yet another embodiment, the substrate 101 includes portions to form a semiconductor-on-insulator (SOI) substrate. In other alternatives, the substrate 101 may include a doped epitaxial layer, a gradient semiconductor layer, and/or a semiconductor layer overlaying another semiconductor layer of a different type, such as a silicon layer on a silicon germanium layer. In an embodiment, the substrate 101 is a hybrid substrate including first portions formed of a bulk silicon substrate and second portions formed of an SOI substrate. The structure and forming method of the hybrid substrate are described in greater detail later.

In some embodiments, the semiconductor wafer 100 includes a circular shape from a top-view perspective. In some other embodiments, the semiconductor wafer 100 includes a polygonal shape, such as a rectangular shape, a square shape or other suitable shapes. In some embodiments, the substrate 101 has a thickness between about 700 μm and about 750 μm, such as 700 μm.

Each of the semiconductor devices 102 may include various functional components, for example, transistors, diodes, capacitors or interconnect features, formed on a surface of the substrate 101. A scribe line area 104 is defined between adjacent semiconductor devices 102. The scribe line area 104 includes scribe lines formed of intersecting columns and rows on the substrate 101. After the fabrication or testing processes for the semiconductor devices 102 are completed, the semiconductor wafer 100 are singulated into individual dies by cutting through the scribe line area 104.

Figure 2A:
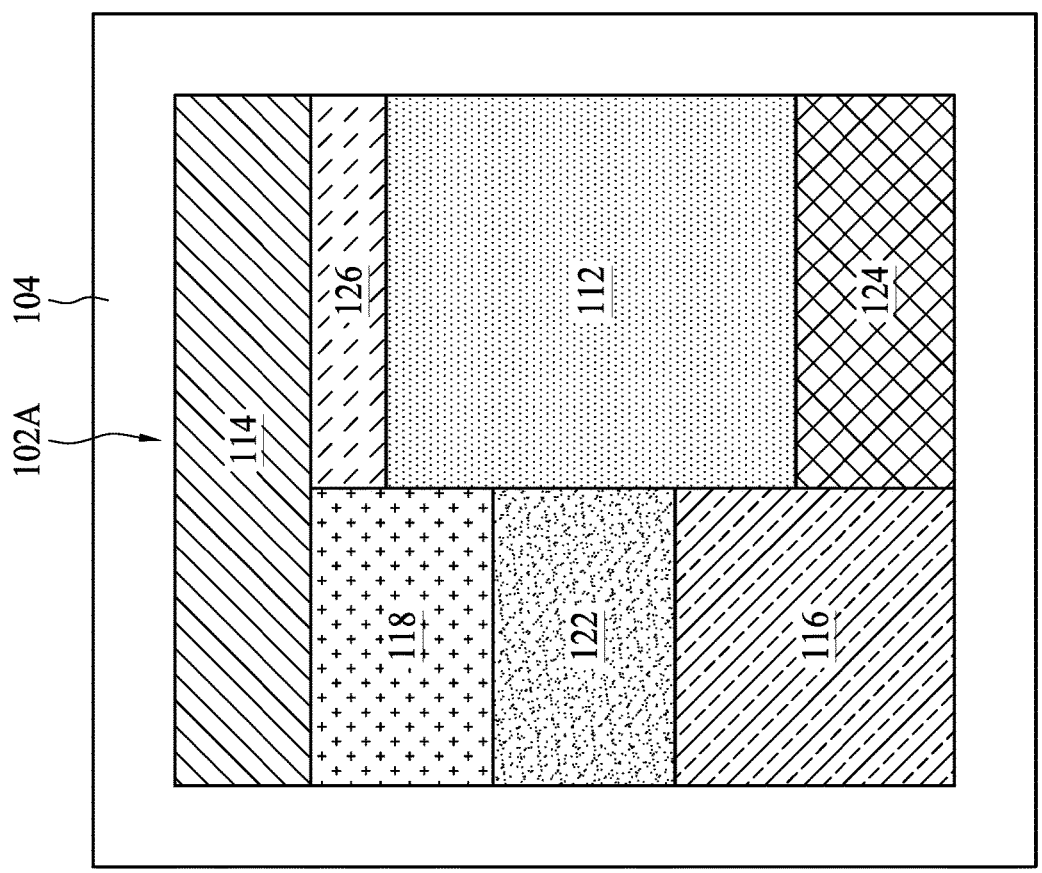
FIGS. 2A, 2B and 2C are schematic zoomed views of a portion of the semiconductor wafer shown in FIG. 1, in accordance with various embodiments of the present disclosure.

FIG. 2A is a schematic zoomed view of a portion 200A of the semiconductor wafer shown in FIG. 1, in accordance with various embodiments of the present disclosure. In some embodiments, the portion 200A includes an exemplary semiconductor die 102A and a scribe line area 104. The scribe line area 104 laterally surrounds the semiconductor die 102A.

The semiconductor die 102A is partitioned into a plurality of blocks 112, 114, 116, 118, 122, 124 and 126. In some embodiments, the blocks 112, 114, 116 and 118 are configured as first-type blocks for forming digital devices and/or analog devices. In some embodiments, examples of the digital device formed in the first-type blocks include a signal processor device, a memory device, a sensor device, or other suitable digital devices. In some embodiments, examples of the analog device formed in the first-type blocks include an operational amplifier device, an analog-to-digital converter device or digital-to-analog converter device, a comparator, or other suitable analog devices. The first-type blocks 112, 114, 116 and 118 may be arranged in a quadrilateral shape, such as a rectangular shape or a square shape. In some embodiments, the first-type blocks 112, 114, 116 and 118 are arranged separate from each other or joined to each other.

The first-type blocks 112, 114, 116 and 118 are formed in a bulk material region, referred to as a first-type region, of the substrate 101. The first-type region may include a bulk material in the substrate 101, such as silicon. In some other embodiments, other suitable bulk materials, such as germanium or silicon germanium, may be used. The bulk material with a sufficient thickness used in the first-type blocks 112, 114, 116 and 118 of the substrate 101 may aid in reducing undesired effects, such as the floating-body effect.

In some embodiments, the blocks 122, 124 and 126 are configured as second-type blocks for forming radio frequency devices. In some embodiments, examples of the radio frequency device used in the first-type blocks include a switch device, a low-noise amplifier device, a power amplifier, or other suitable digital devices. The second-type blocks 122, 124 and 126 may be arranged in a quadrilateral shape, such as a rectangular shape, a square shape or other suitable shapes. In some embodiments, the second-type blocks 122, 124 and 126 are arranged separate from each other or joined to each other.

The second-type blocks 122, 124 and 126 are formed in an SOI region, referred to as a second-type region, of the substrate 101. The second-type region may include a semiconductor material, such as silicon, formed over an insulator material. In some other embodiments, the insulator material is embedded in the semiconductor material, in which only the portions of the semiconductor material over the insulator is used where functional elements of the second-type devices are formed thereon.

One or more of the first-type blocks 112, 114, 116, 118 may be arranged between one or more of the second-type blocks 122, 124 and 126, and vice versa. In some embodiments, the semiconductor die 102A includes isolation regions (not shown) in a boundary between a first-type block 112, 114, 116, 118 and a second-type block 122, 124, 126.

Figure 2B:
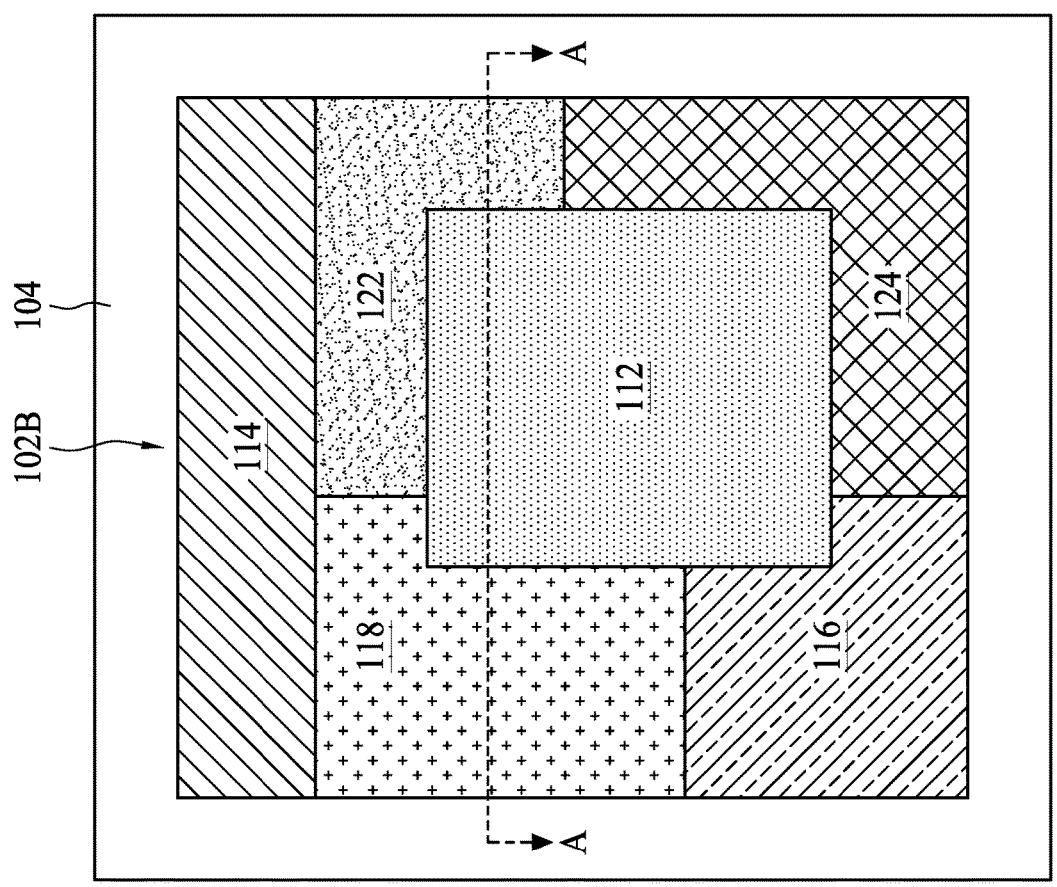

FIG. 2B is a schematic zoomed view of a portion 200B of the semiconductor wafer shown in FIG. 1, in accordance with various embodiments of the present disclosure. In some embodiments, the portion 200B includes an exemplary semiconductor die 102B and a scribe line area 104. The scribe line area 104 laterally surrounds the semiconductor die 102B. The semiconductor die 102B is similar to the semiconductor die 102A, and descriptions of similar aspects are omitted for brevity. The semiconductor die 102B is different from the semiconductor die 102A in the location arrangement for the first-type blocks and the second-type blocks. As shown in FIG. 2B, the first-type block 112 is laterally surrounded by the first-type blocks 116, 118 and the second-type blocks 122 and 124. In some embodiments, the first-type blocks 116, 118 and the second-type blocks 122 and 124 is in an L-shape.

Figure 2C:
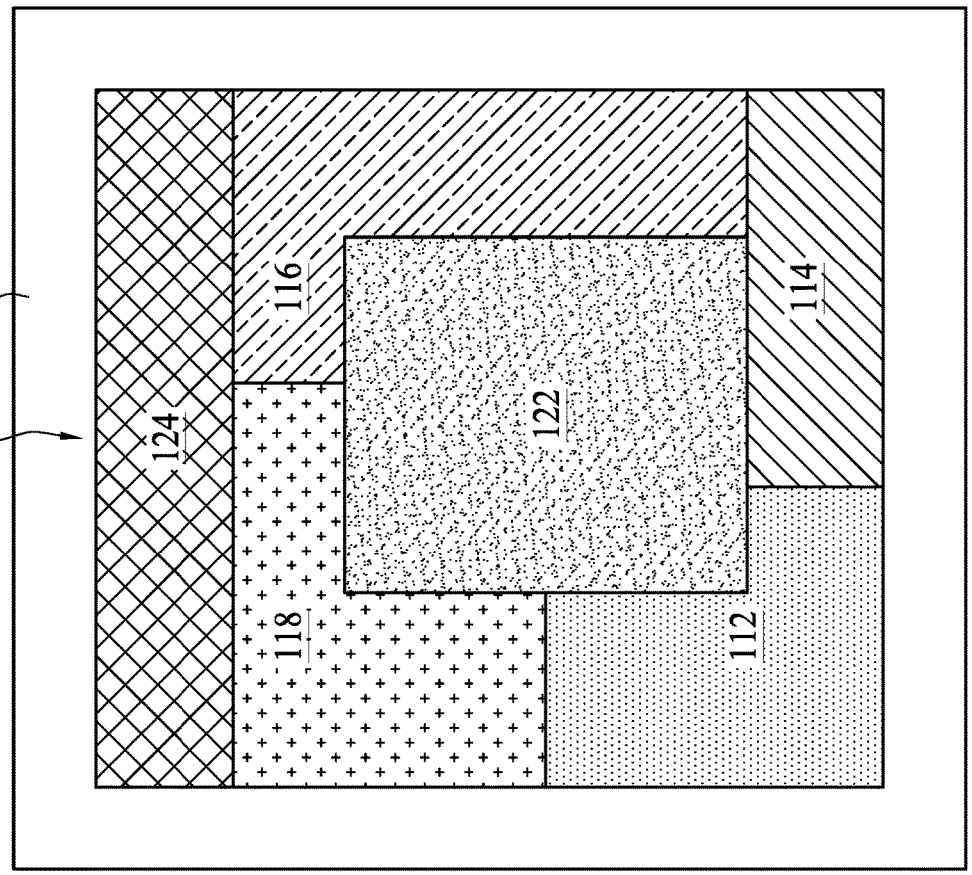

FIG. 2C is a schematic zoomed view of a portion 200C of the semiconductor wafer shown in FIG. 1, in accordance with various embodiments of the present disclosure. In some embodiments, the portion 200C includes an exemplary semiconductor die 102C and a scribe line area 104. The scribe line area 104 laterally surrounds the semiconductor die 102C. The semiconductor die 102C is similar to the semiconductor dies 102A and 102B, and descriptions of similar aspects are omitted for brevity. The semiconductor die 102C is different from the semiconductor die 102A or 102B in the location arrangements of the first-type blocks and the second-type blocks. As shown in FIG. 2C, the second-type block 122 is laterally surrounded by all first-type blocks 112, 114, 116 and 118.

In some embodiments, the scribe line area 104 is configured as one of the first-type block and the second-type block according to design requirements. In some embodiments, the scribe line area 104 includes multiple first-type blocks and/or second-type blocks on which first-type devices and second-type devices are formed respectively. In some embodiments, the scribe line area 104 is such partitioned that the first-type blocks or second-type blocks of the scribe line area 104 are immediately adjacent to a same-type block of the adjacent semiconductor die 102.

Figure 3A:
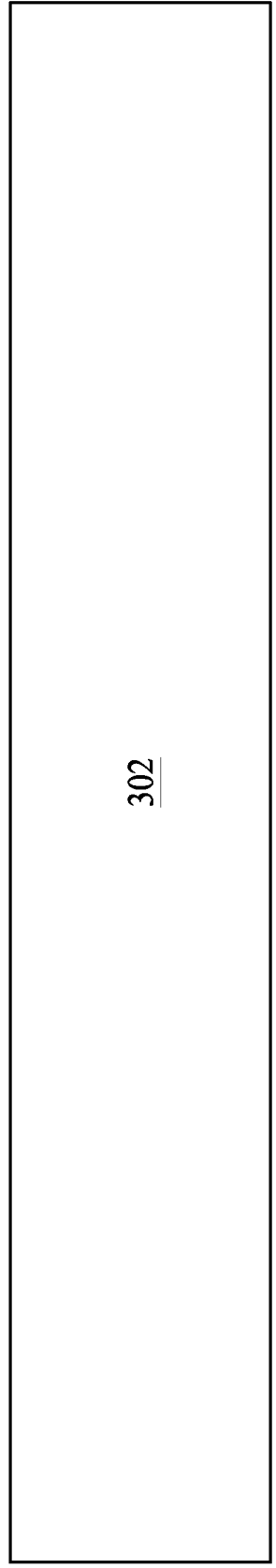
FIG. 3A to FIG. 3V are cross-sectional views of intermediate stages of a method of manufacturing a semiconductor structure, in accordance with some embodiments.
Figure 3B:
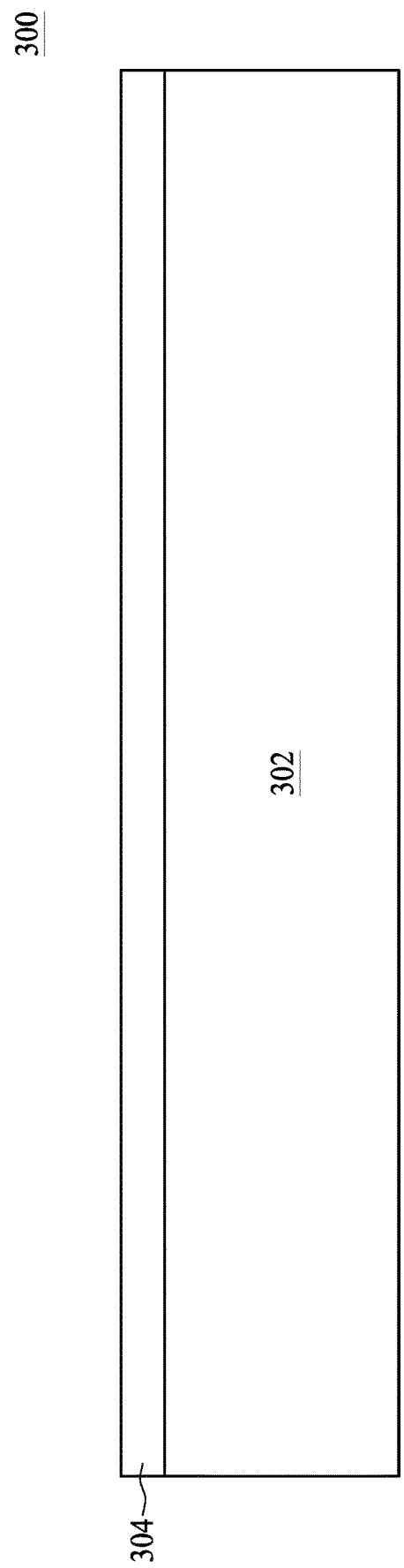
Figure 3C:
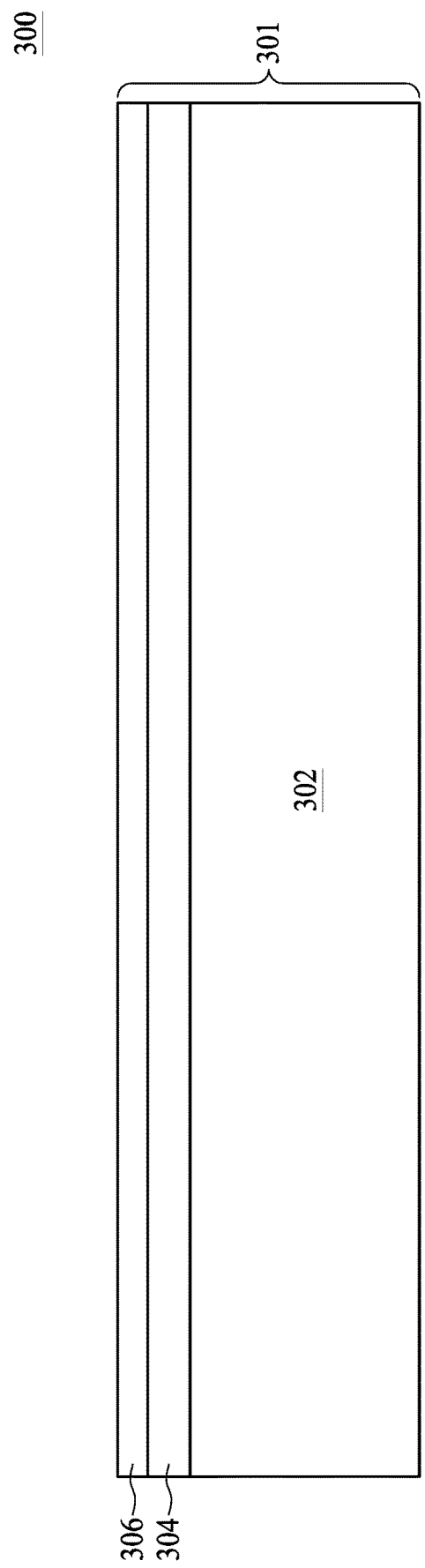
Figure 3D:
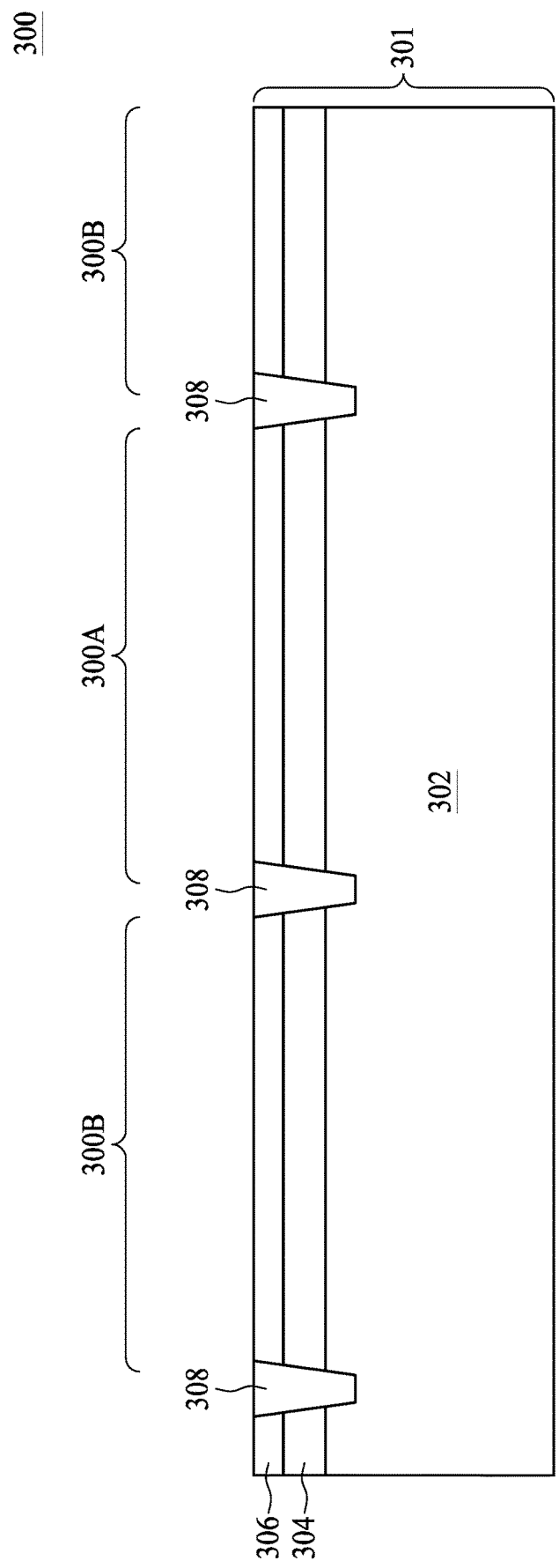
Figure 3E:
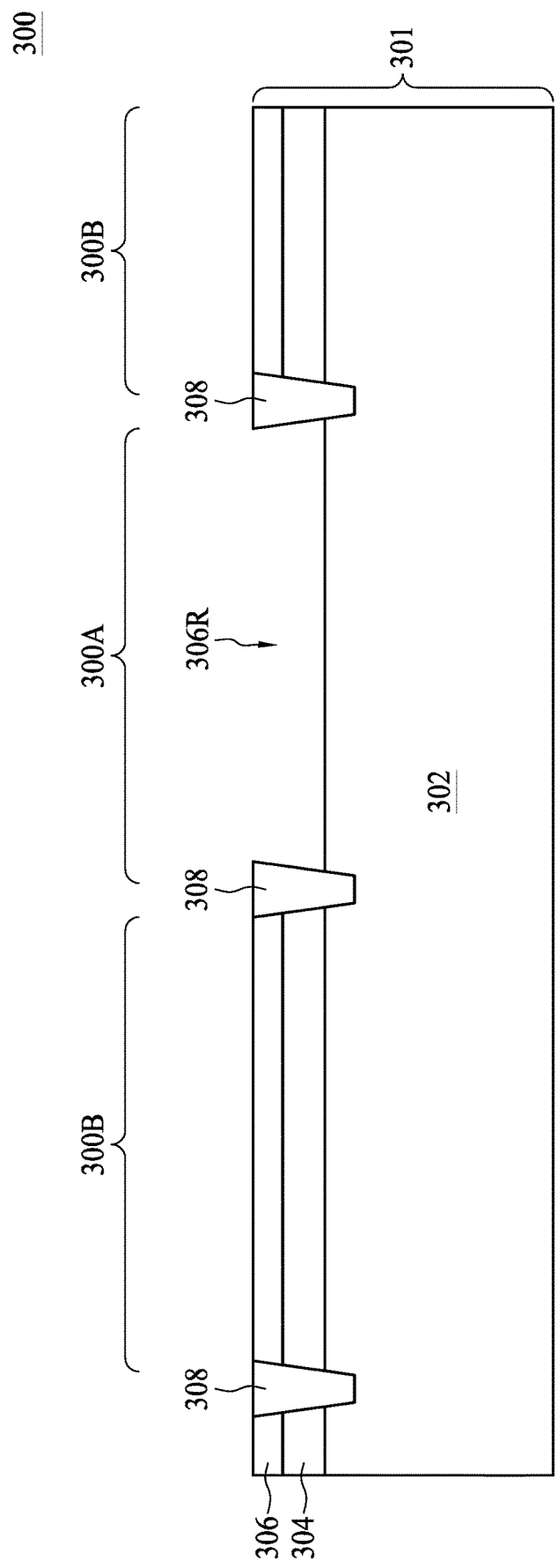
Figure 3F:
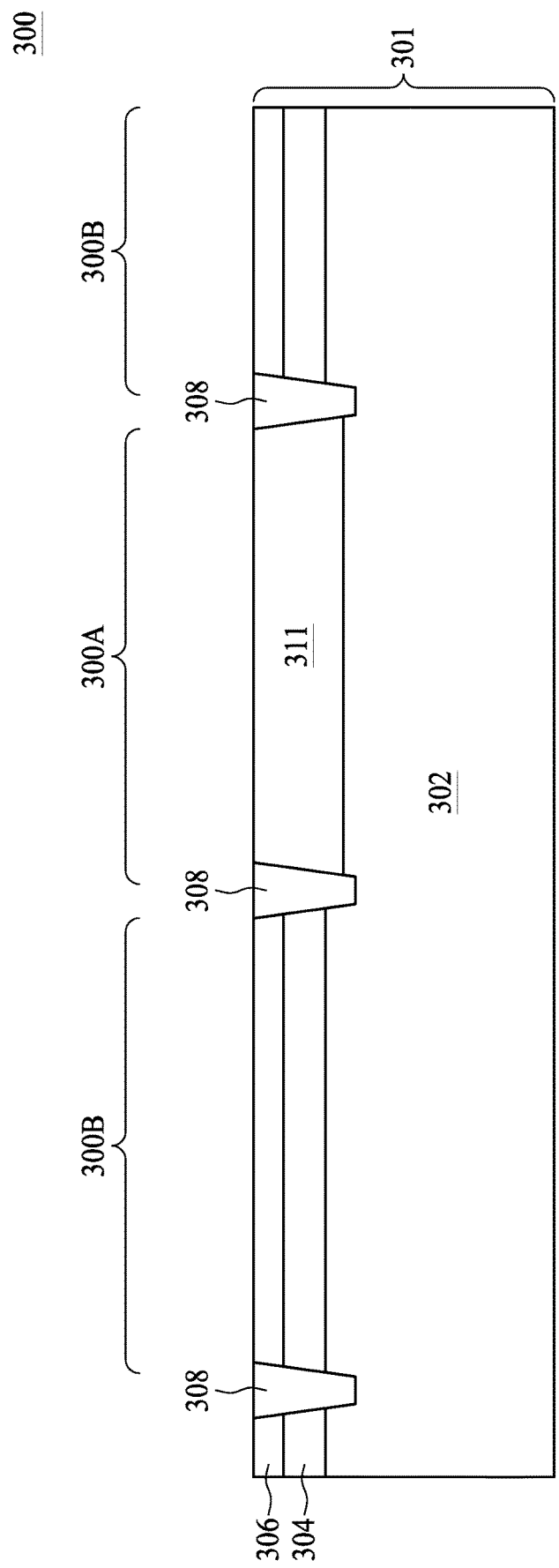
Figure 3G:
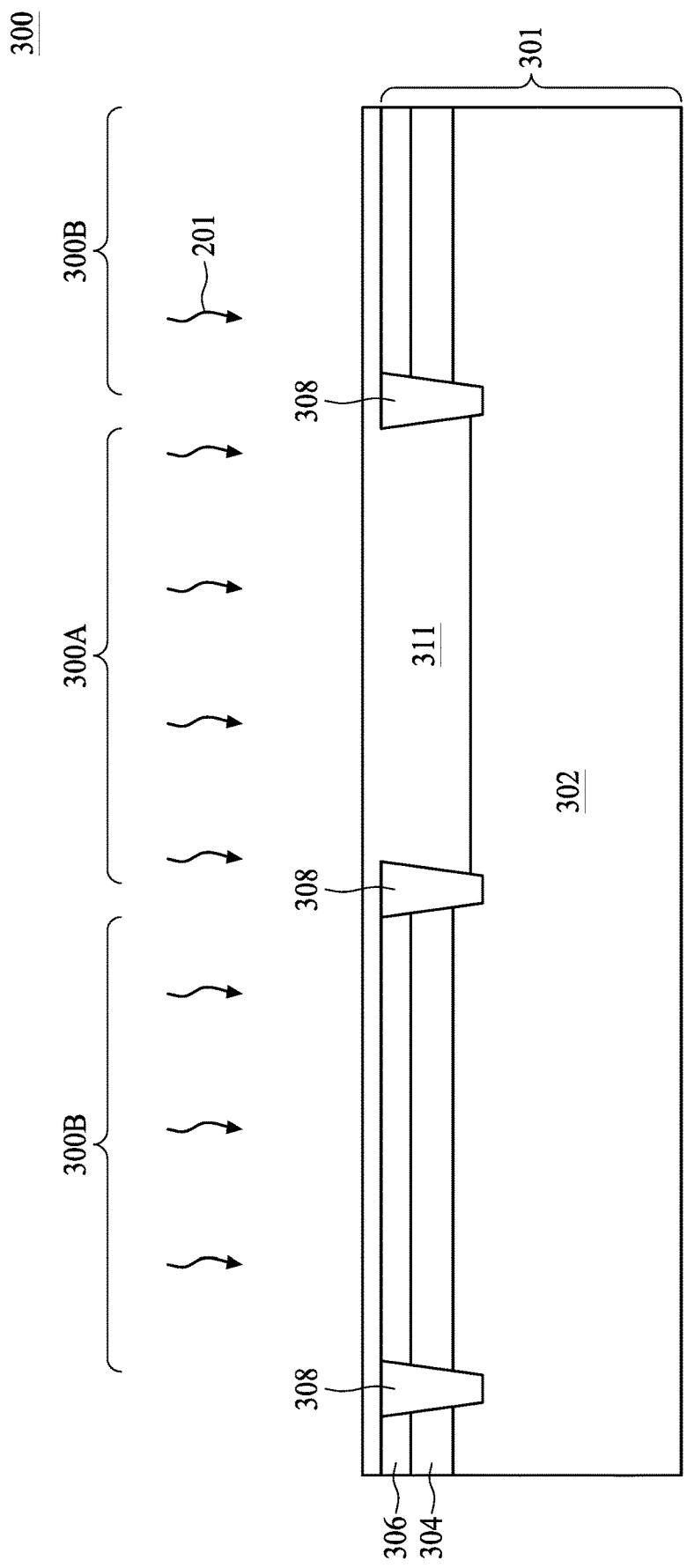
Figure 3H:
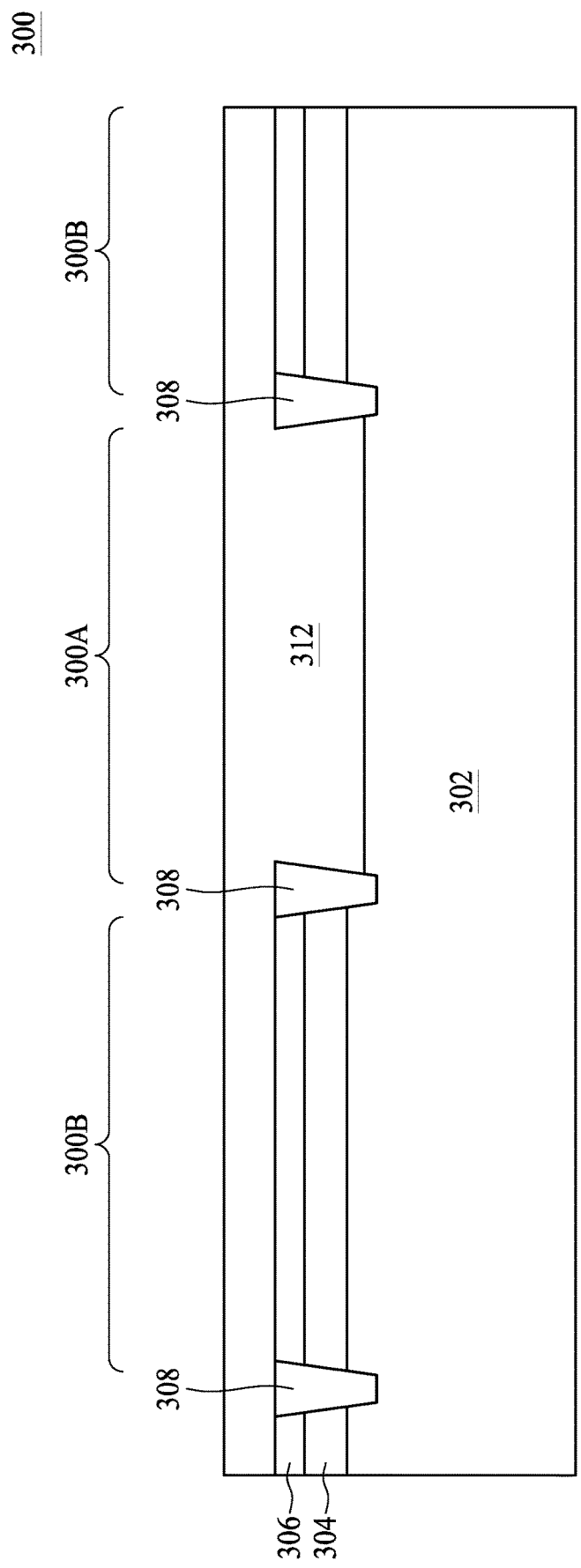
Figure 3I:
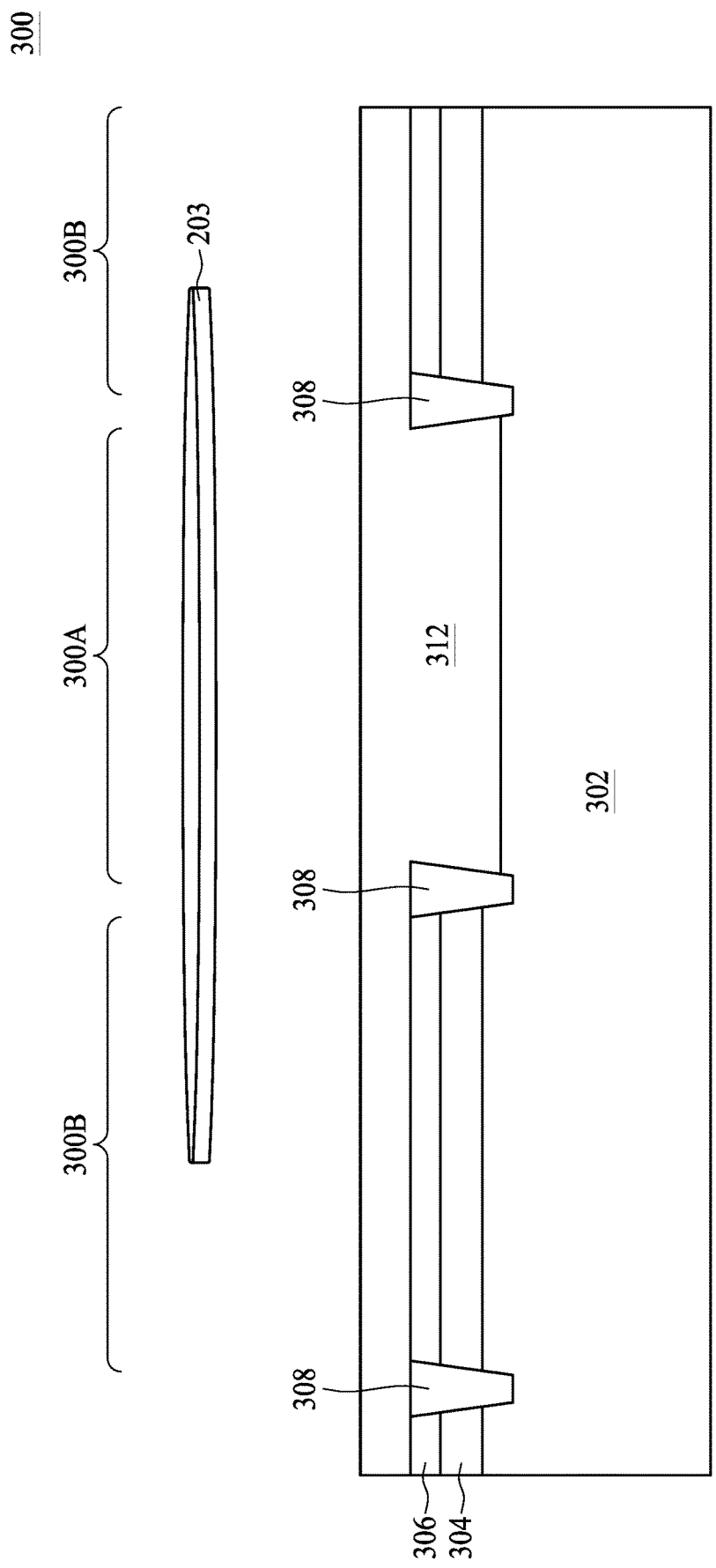
Figure 3J:
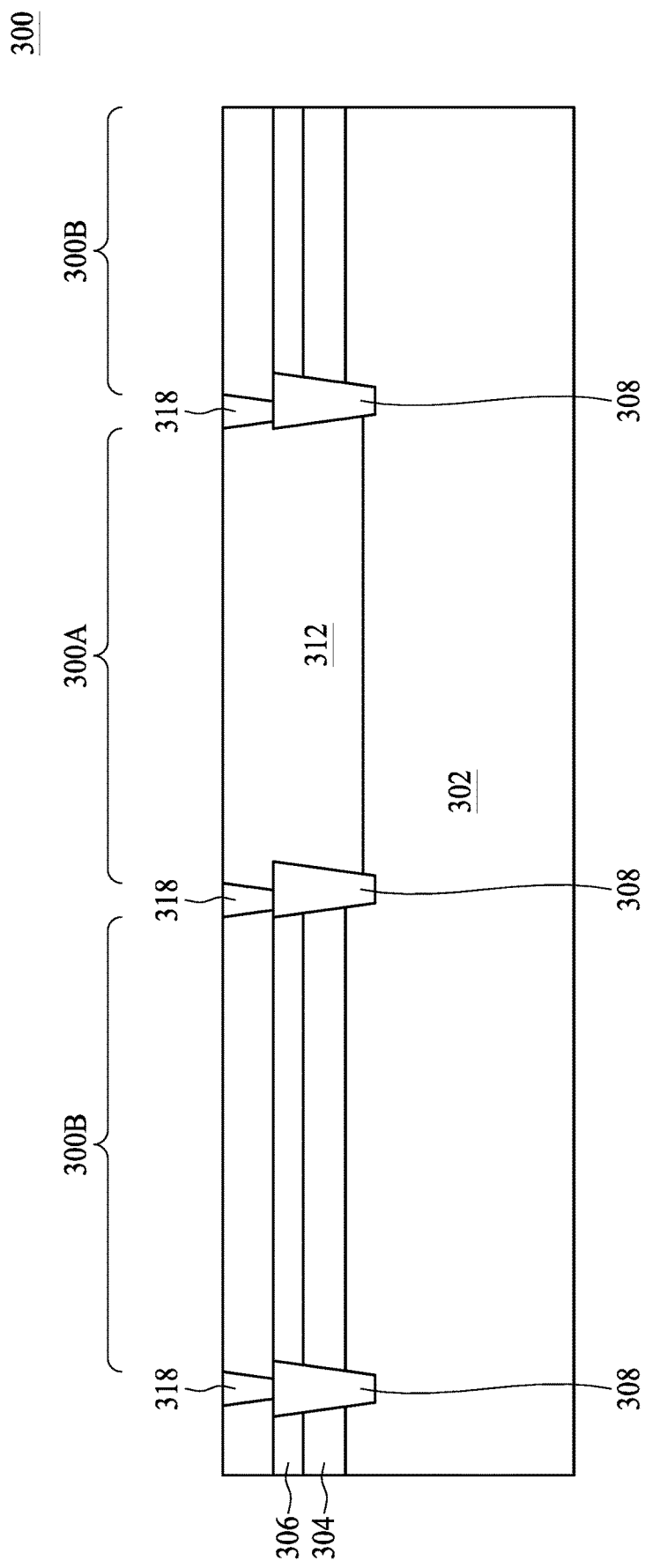
Figure 3K:
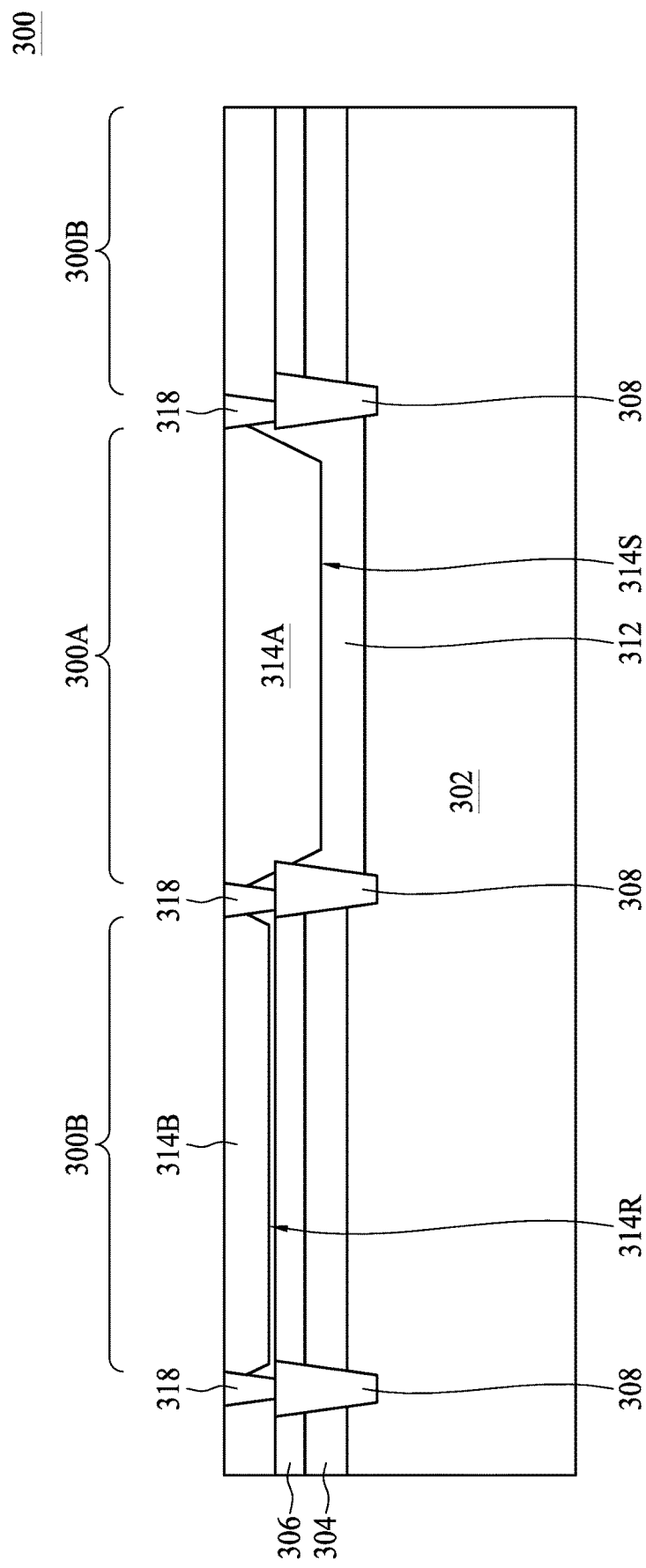
Figure 3L:
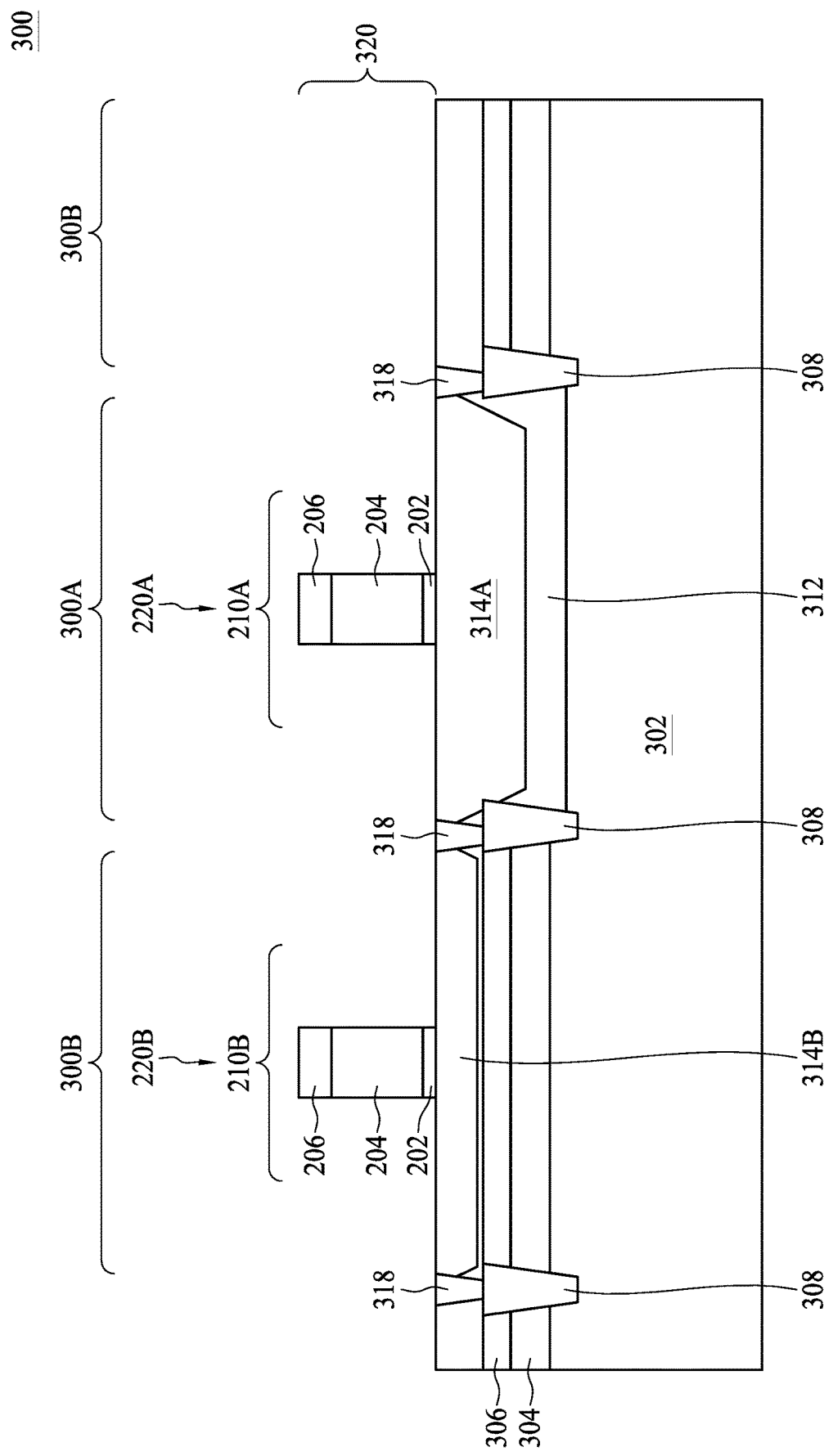
Figure 3M:
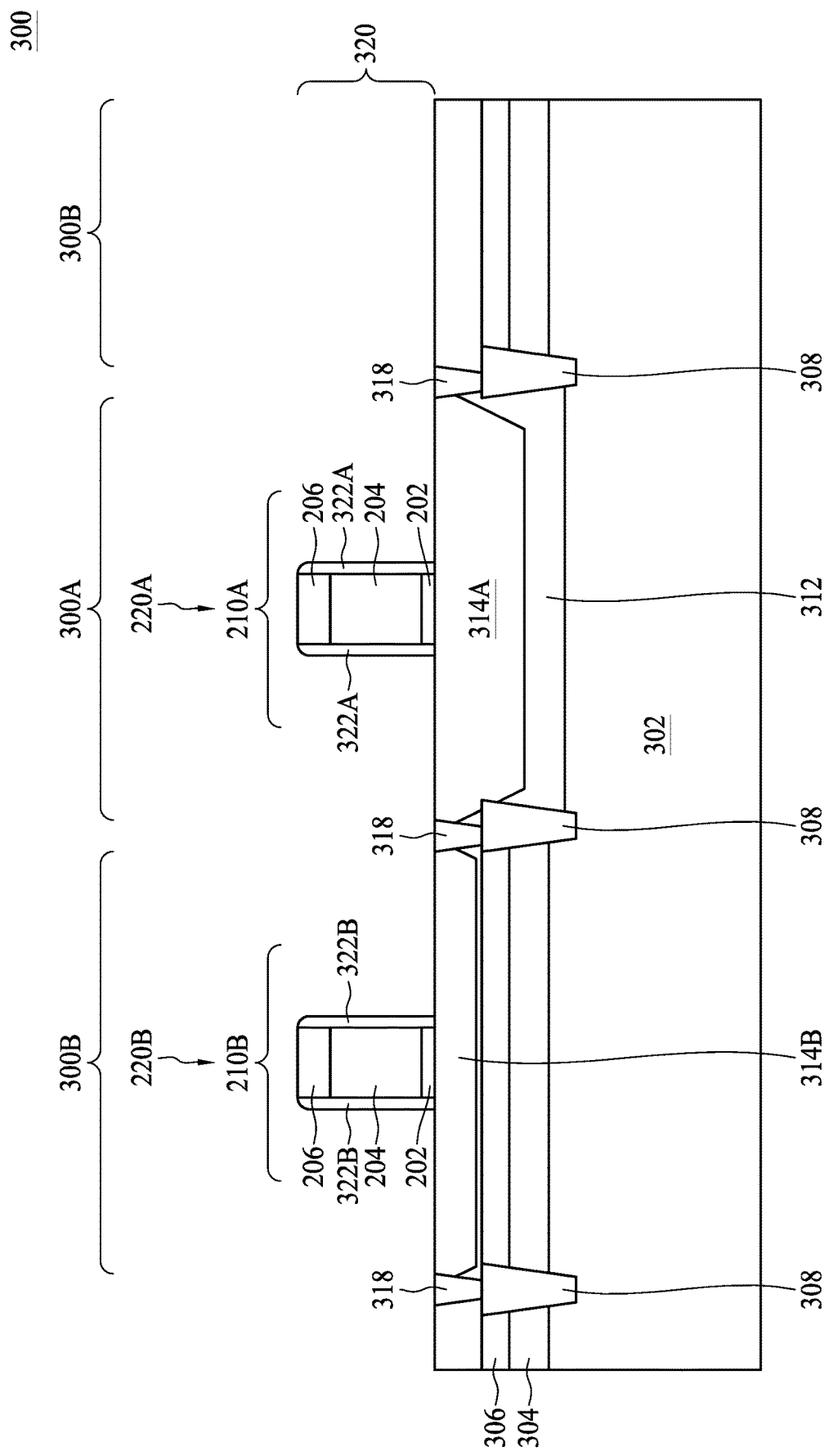
Figure 3N:
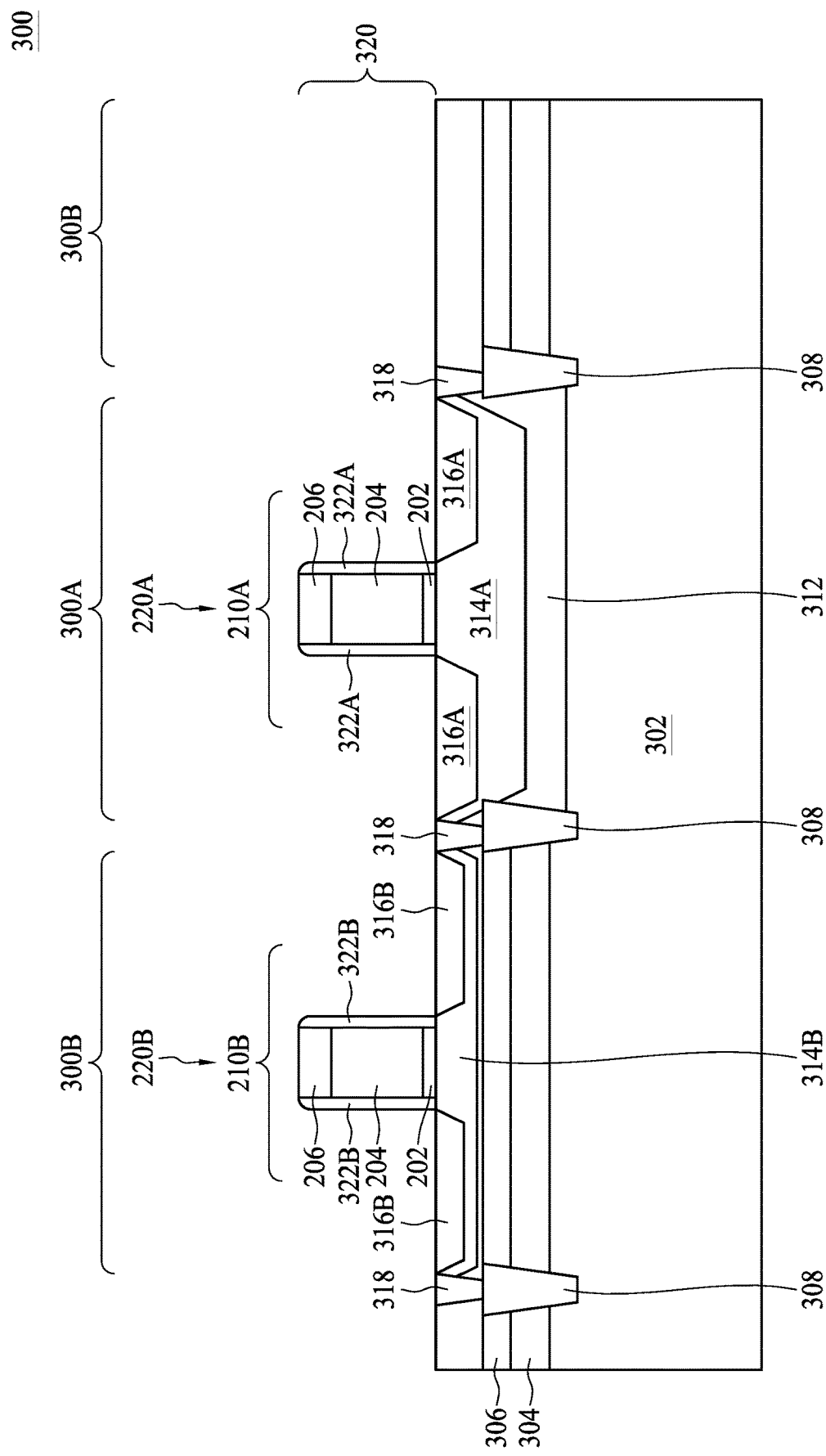
Figure 3O:
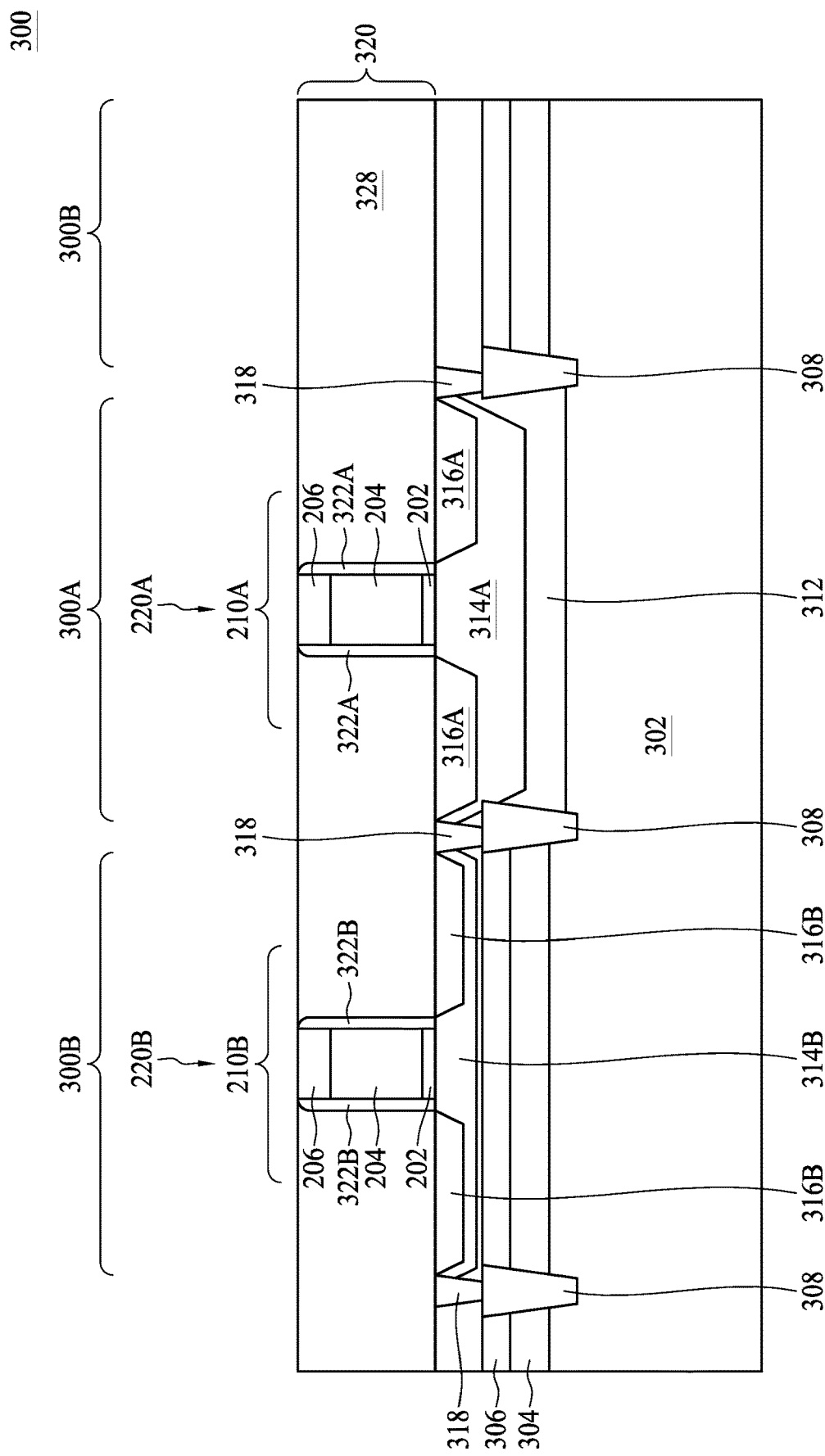
Figure 3P:
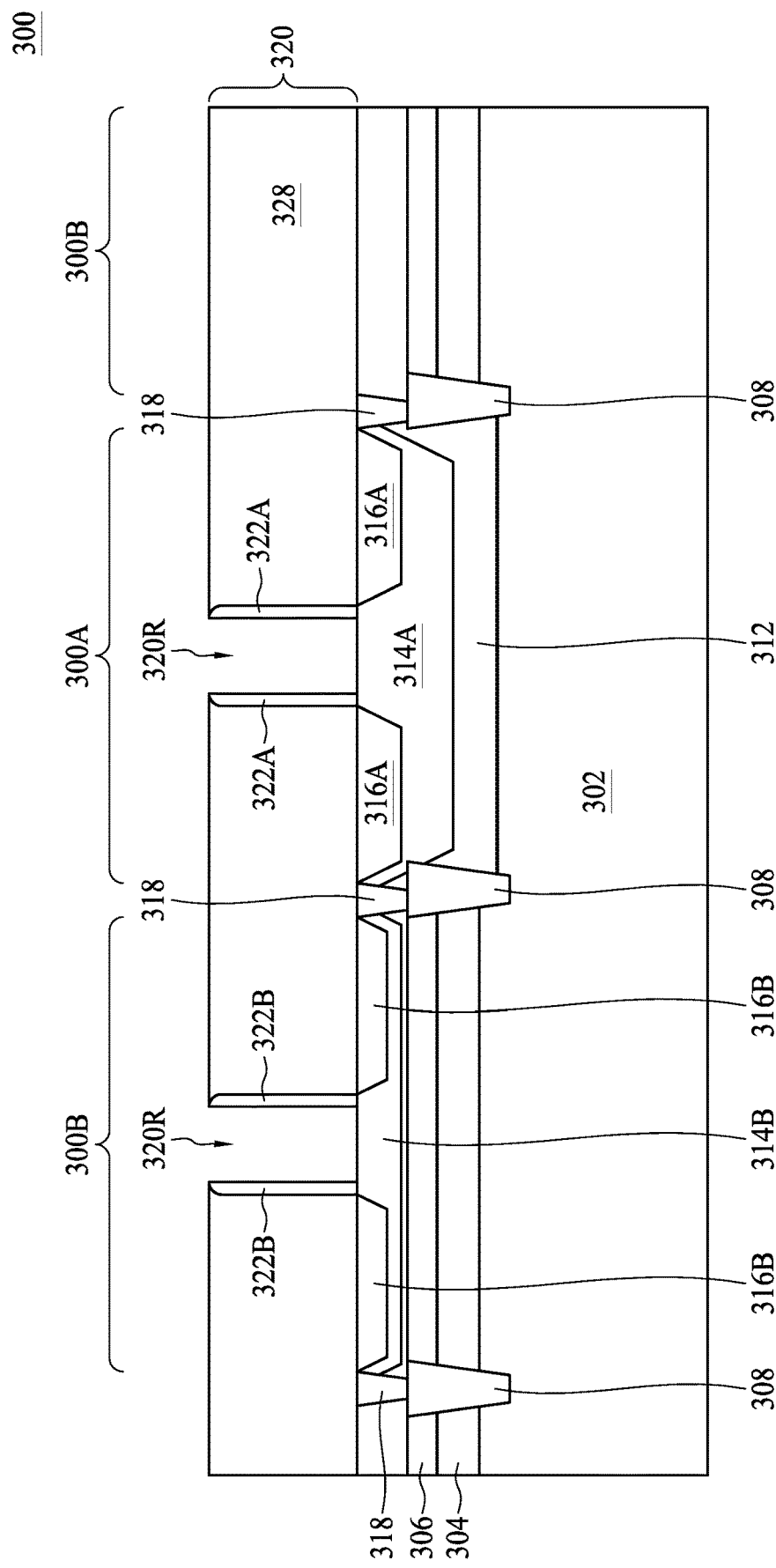
Figure 3Q:
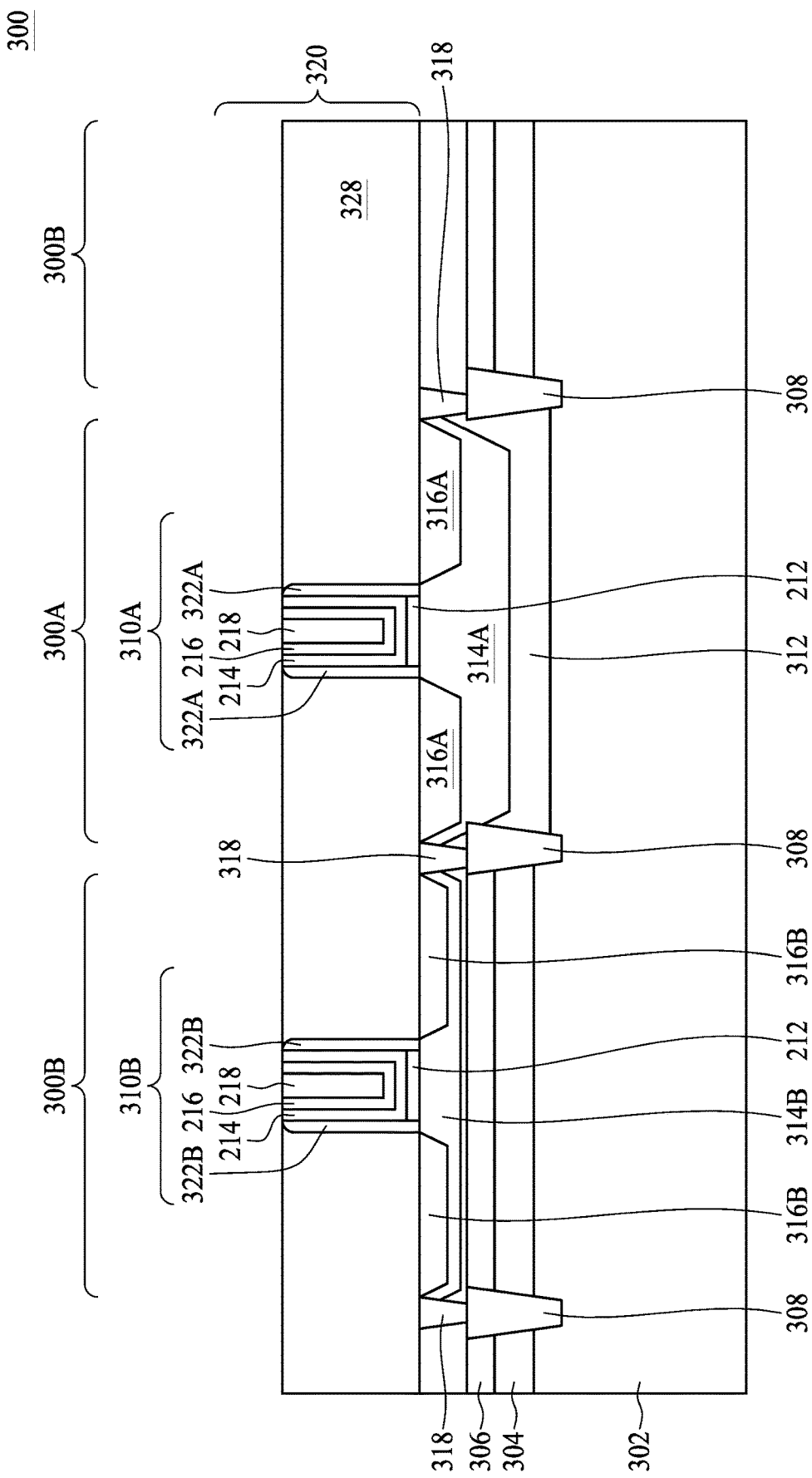
Figure 3R:
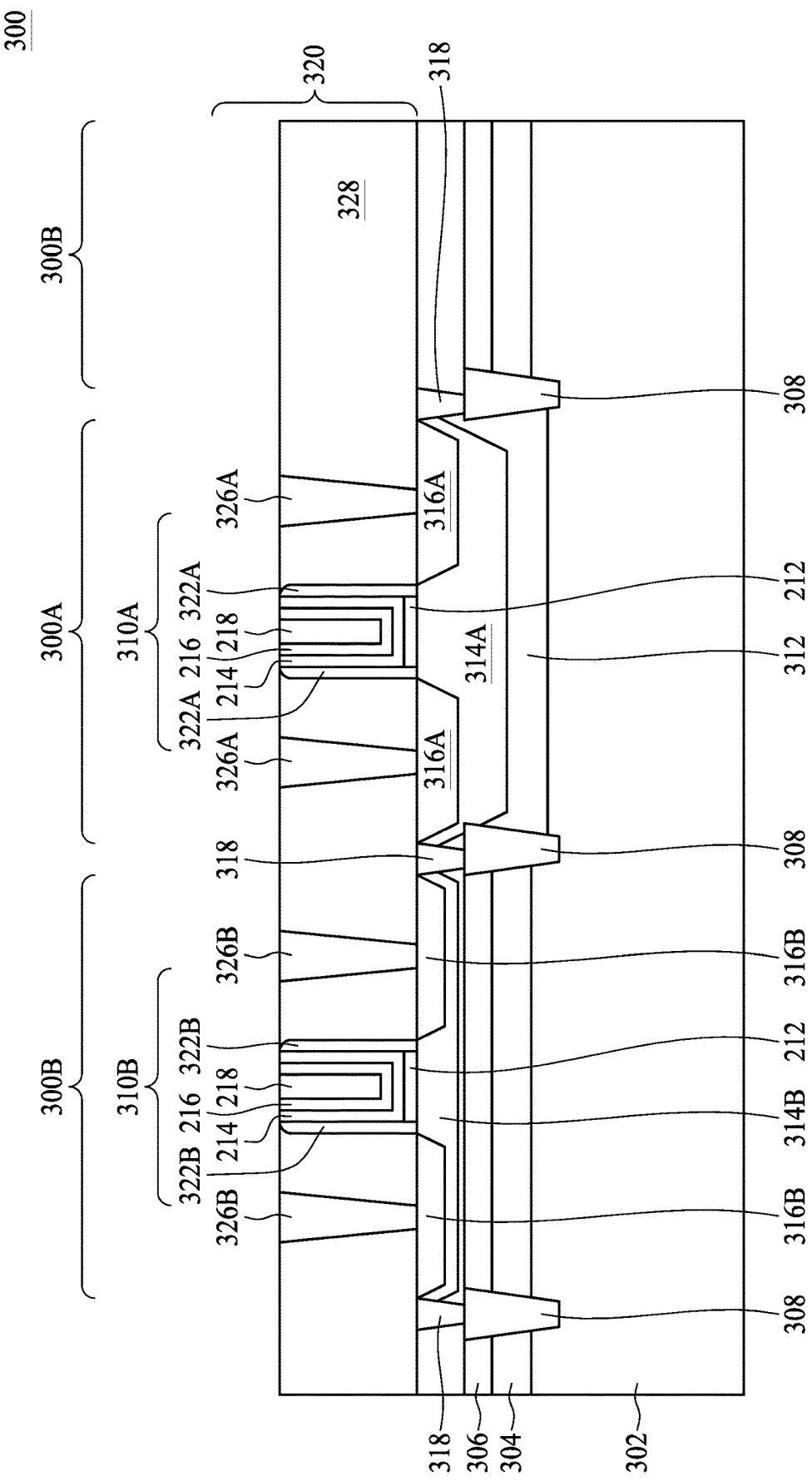
Figure 3S:
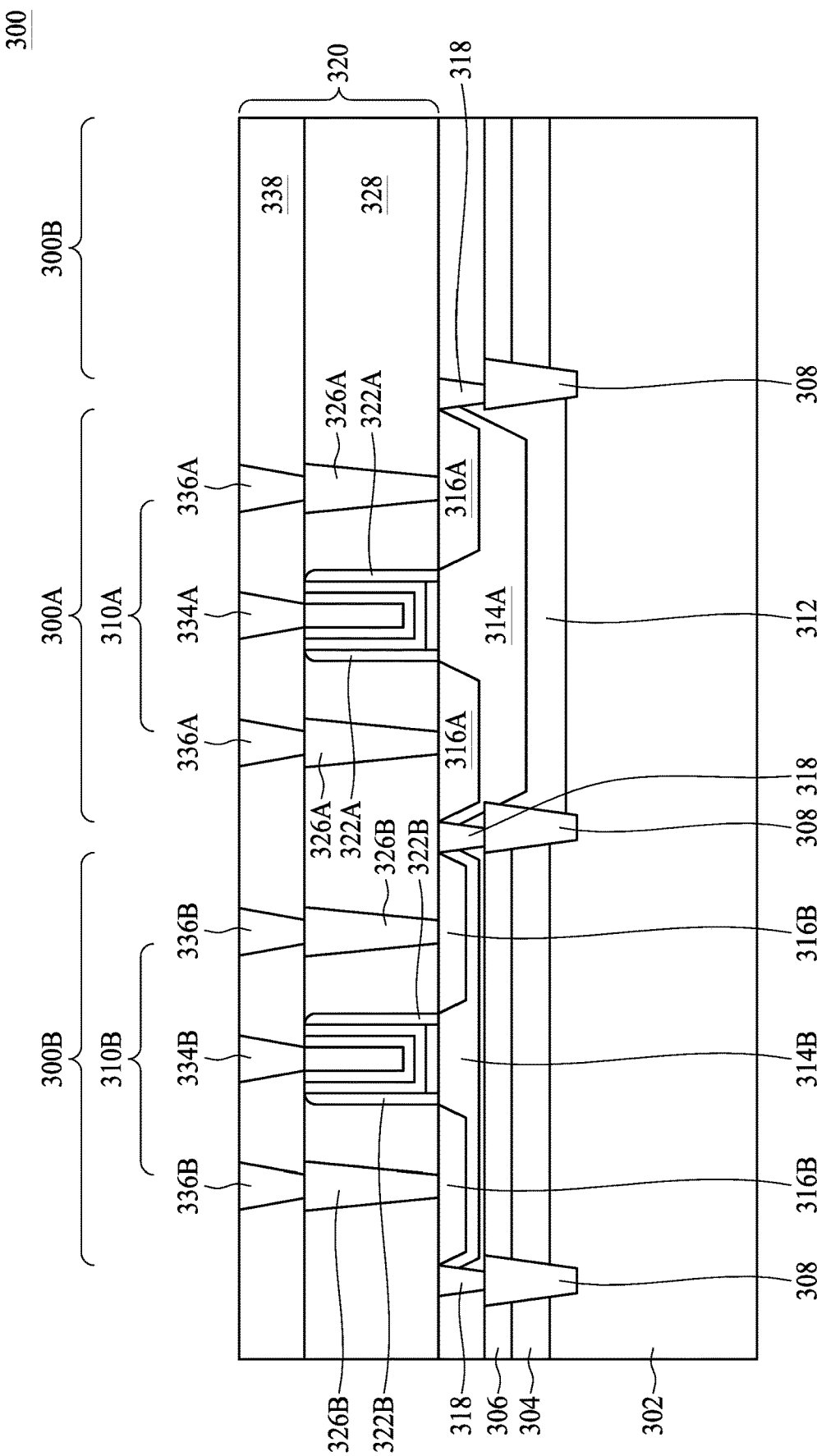
Figure 3T:
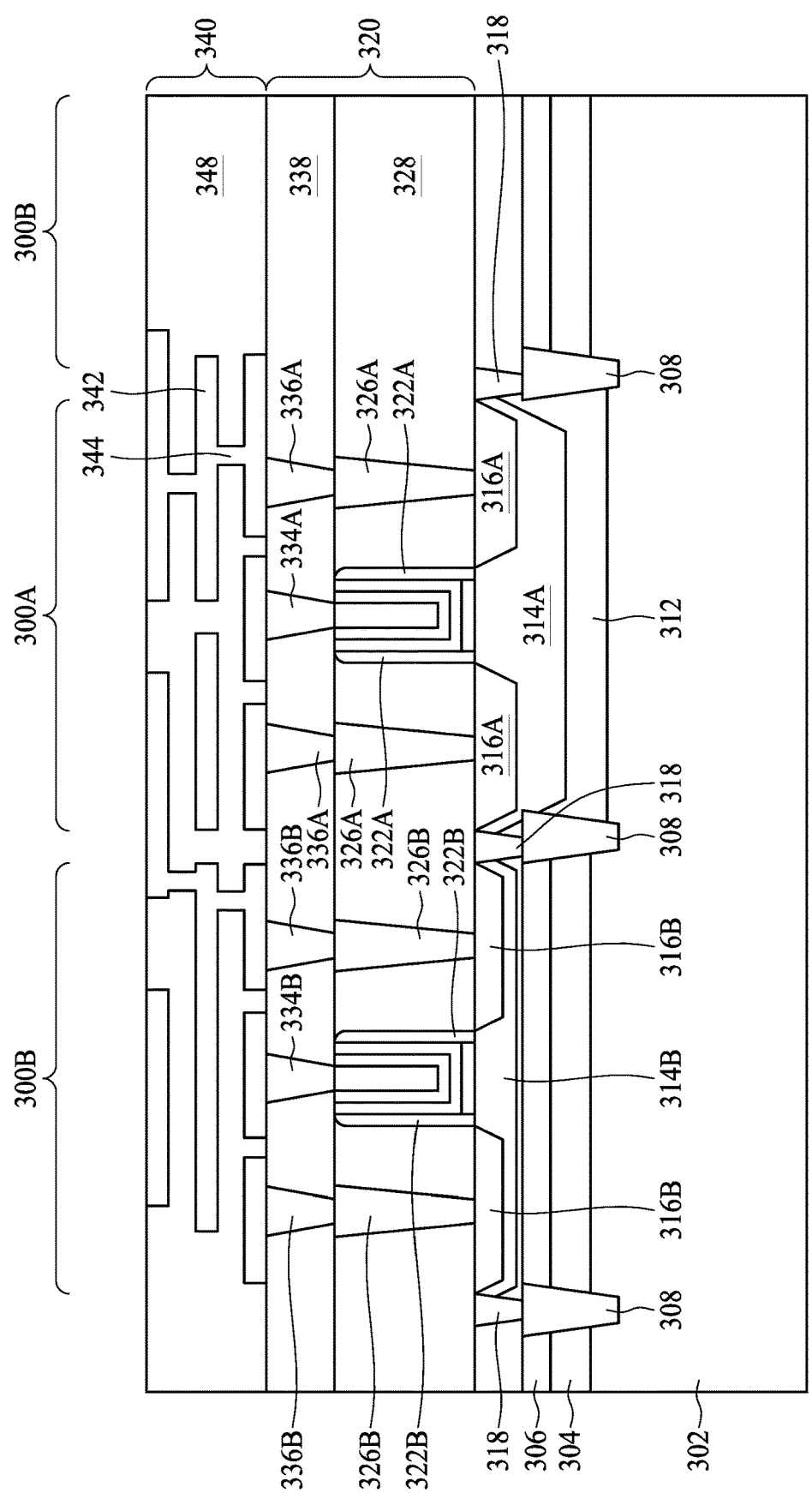
Figure 3U:
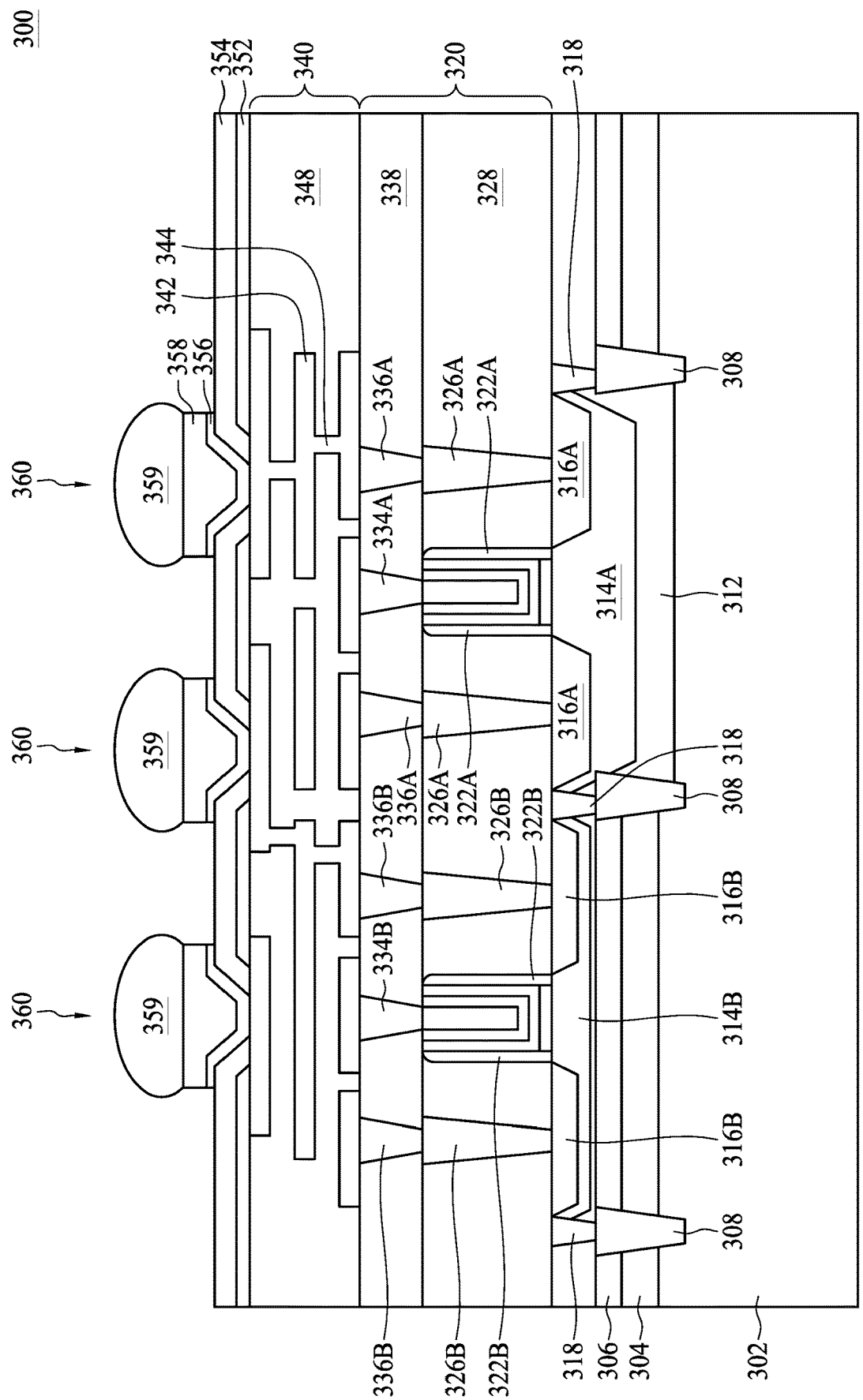
Figure 3V:
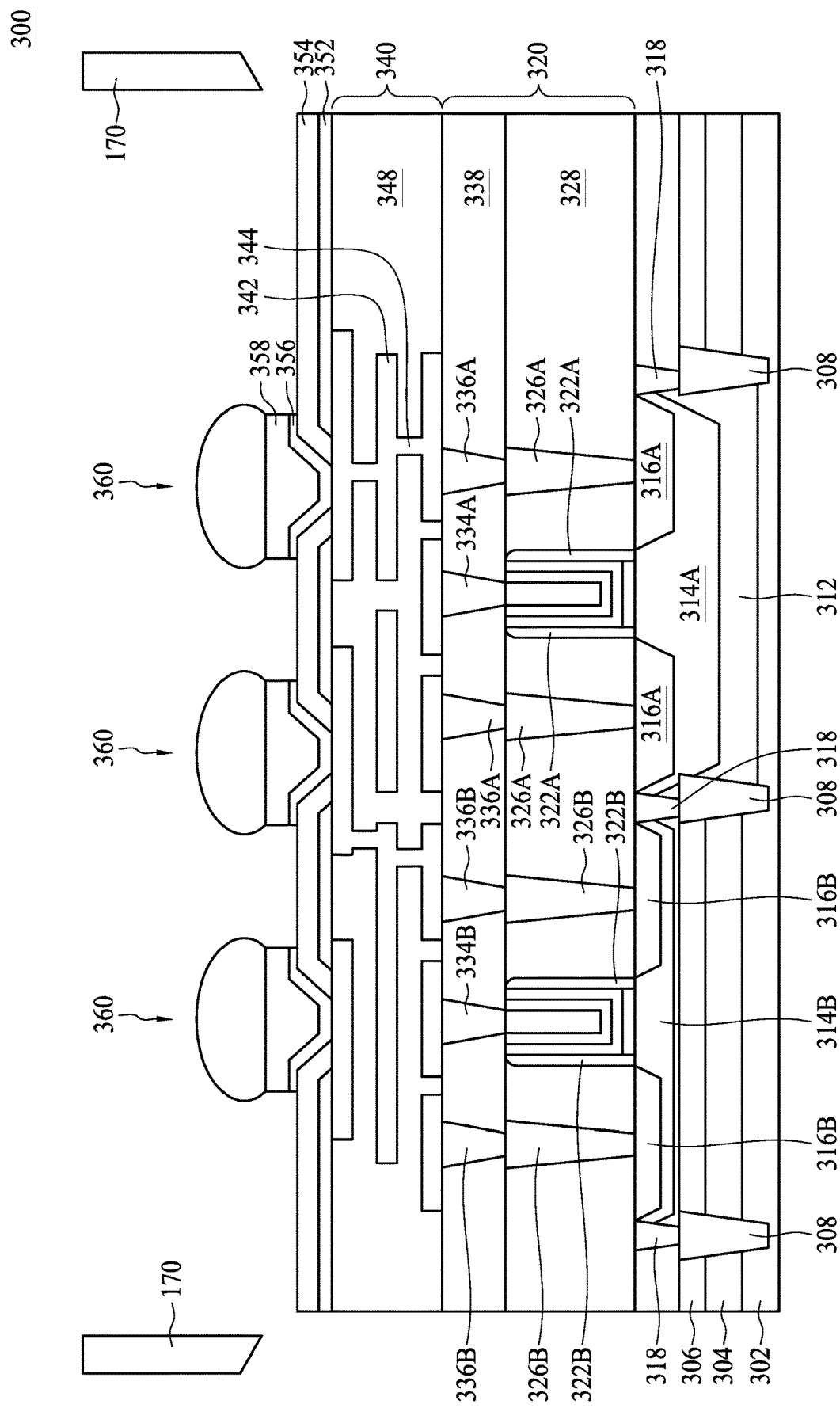

FIG. 3A to FIG. 3V are cross-sectional views of intermediate stages of a method of manufacturing a semiconductor structure 300, in accordance with some embodiments. Referring to FIG. 3A, a substrate 302 is provided or formed. In some embodiments, the substrate 302 is a bulk material, e.g. bulk silicon. In some other embodiments, the substrate 302 includes other semiconductor materials, such as silicon germanium, silicon carbide, gallium arsenide, or the like. In some embodiments, the substrate 302 is a p-type semiconductive substrate (acceptor type) or an n-type semiconductive substrate (donor type). Alternatively, the substrate 302 includes another elementary semiconductor, such as germanium; a compound semiconductor including gallium arsenic, gallium phosphide, indium phosphide, indium arsenide, or indium antimonide, an alloy semiconductor including SiGe, GaAsP, AlInAs, AlGaAs, GaInAs, GaInP, or GaInAsP; or combinations thereof. In other alternatives, the substrate 302 may include a doped epitaxial layer, a gradient semiconductor layer, and/or a semiconductor layer overlaying another semiconductor layer of a different type, such as a silicon layer on a silicon germanium layer.

In some embodiments, the substrate 302 includes a circular shape from a top-view perspective. In some other embodiments, the substrate 302 includes a polygonal shape, such as a rectangular shape, a square shape or other suitable shapes. In some embodiments, the substrate 302 includes a resistivity between about 1000 Ω-cm and about 18000 Ω-cm. In some embodiments, the substrate has a thickness between about 700 μm and about 1000 μm, such as 750 μm. In some embodiments, the substrate 302 includes a low oxygen concentration. The oxygen concentration of the substrate 302 may be less than about 1 ppma, less than about 2 ppma, less than about 5 ppma or less than about 10 ppma.

Referring to FIG. 3B, a trap-rich layer 304 is optionally deposited over the substrate 302. The trap-rich layer 304 has a high density of carrier traps relative to the substrate 302 and/or relative to the subsequently-formed epitaxial layer 312. The carrier traps may exist in a form of dislocations and/or other defects in the crystalline lattice of the trap-rich layer 304. In some embodiments, mobile carriers (e.g., mobile electrons) along a top surface of the substrate 302 are trapped by these carrier traps. As a result, the effect of parasitic surface conduction (PSC) can be reduced. In some embodiments, the trap-rich layer 304 provides advantages, e.g., a low crosstalk, a low substrate and/or RF loss, a high Q-factor, and a high linearity to thereby improve the performance of a second-type device formed thereof.

In some embodiments, the trap-rich layer 304 includes undoped polycrystalline silicon, amorphous silicon, or some other suitable semiconductor material. In embodiments in which the trap-rich layer 304 includes undoped polycrystalline silicon, the carrier traps may concentrate at grain boundaries of the undoped polycrystalline silicon. The trap-rich layer 304 may include a thickness between about 1000 angstrom and about 5000 angstrom, between about 1500 angstrom and about 4000 angstrom, between about 1800 angstrom and about 3000 angstrom, such as 2000 angstrom. In some embodiments, the trap-rich layer 304 is formed using chemical vapor deposition (CVD), physical vapor deposition (PVD), atomic layer deposition (ALD), or other suitable deposition methods.

Referring to FIG. 3C, an insulator layer 306 is formed over the trap-rich layer 304. In some embodiments, the trap-rich layer 304 is absent from the semiconductor structure 300, and thus the insulator layer 306 is formed directly over the substrate 302. The insulator layer 306 may include silicon oxide, dioxide, silicon nitride, silicon-rich oxide (SRO), aluminum oxide, magnesium oxide, and/or other dielectric materials. In some embodiments, the insulator layer 306 includes a multilayer structure including one or more different materials. The insulator layer 306 may include a thickness between about 1000 angstrom and about 5000 angstrom, between about 1500 angstrom and about 4000 angstrom, between about 1800 angstrom and about 3000 angstrom, such as 2000 angstrom. In some embodiments, the insulator layer 306 is formed using CVD, PVD, ALD, or other suitable deposition methods.

In some embodiments, as shown in FIG. 3C a composite substrate 301 is provided, in which the trap-rich layer 304 and the insulator layer 306 are arranged over the semiconductor substrate 302. In some other embodiments, another composite substrate including the substrate 302 and the insulator layer 306 (absent the trap-rich layer 304) are provided. The composite substrate 301 as shown in FIG. 3C may be provided by a third-party vendor.

Referring to FIG. 3D, isolation regions 308 are formed through the insulator layer 306 and the trap-rich layer 304. In some embodiments, the isolation regions 308 extend downward to the substrate 302. The isolation regions 308 are sometimes referred to as shallow trench isolation (STI) regions. The isolation regions 308 may have a bottom surface lower than the bottom surface of the trap-rich layer 304 or the insulator layer 306. The isolation regions 308 may be used to define a plurality of first-type regions 300A and a plurality of second-type regions 300B. The first-type regions 300A are allocated for bulk silicon substrates and are similar to the first-type blocks 112, 114, 116, 118 shown in FIGS. 2A to 2C, while the second-type regions 300B are allocated for SOI substrates and are similar to the second-type blocks 122, 124, 126 shown in FIG. 2A to 2C.

The isolation regions 308 may be formed of dielectric materials, such as oxide, nitride, carbide, oxynitride, or other suitable dielectric materials. In some embodiments, the isolation regions 308 include a multilayer structure. As an example formation process, trenches may be etched from the upper surface of the insulator layer 306. One or more dielectric materials of the isolation regions 308 are then deposited in the trenches and over the upper surface of the insulator layer 306. In some embodiments, a planarization operation, such as chemical mechanical planarization (CMP), is performed to level the surface of the isolation regions 308 with the upper surface of the insulator layer 306.

An upper surface of the isolation regions 308 are thus exposed through the insulator layer 306.

Referring to FIG. 3E, a trench or recess 306R is formed in each of the first-type regions 300A. The trench 306R may be formed using an etching operation. In some embodiments, the etching of the trench 306R includes a dry etch, a wet etch, a combination thereof, e.g., reactive ion etch (RIE), and the like. The etching operation may stop on the substrate 302. In some embodiments, the etching operation removes a depth of the substrate 302 in the trench 306R. A portion of the upper surface of the substrate 302 is thus exposed through the etching operation. In some embodiments, the exposed upper surface of the first-type region 300A is lower than the bottom surface of the trap-rich layer 304. In some embodiments, the exposed upper surface of the first-type region 300A is higher than the bottom surface of the trap-rich layer 304.

FIG. 3F to FIG. 3I illustrates a formation of an epitaxial layer 312. In some embodiments, the epitaxial layer 312 includes an epitaxial silicon layer. Referring to FIG. 3F, an initial epitaxial layer 311 is grown from the exposed upper surface of the substrate 302 in the first-type region 300A. The initial epitaxial layer 311 may fill the trench 306R. In some embodiments, the growing of the initial epitaxial layer 311 includes growing monocrystalline silicon in the trench 306R. The growth of the initial epitaxial layer 311 may be performed by one of selective epitaxial growth (SEG) process, a vapor-phase epitaxy (VPE) process, a low pressure chemical vapor deposition (LPCVD) process, an ultra-high vacuum CVD (UHV-CVD) process, a molecular beam epitaxy (MBE) process, or a combination thereof. In some embodiments, the initial epitaxial layer 311 is doped with n-type dopants or p-type dopants. The doping operation may be performed using an ion implantation operation. In some embodiments, the dopants are in-situ implanted during the growth of the initial epitaxial layer 311.

Referring to FIG. 3G, as the growth of the initial epitaxial layer 311 continues, portions of the initial epitaxial layer 311 extends over the surface of the isolation regions 308 adjacent to the initial epitaxial layer 311. In some embodiments, the epitaxial growth causes the initial epitaxial layer 311 to extend over the isolation regions 308 and formed over the surface of the insulator layer 306 in the second-type regions 300B. In some embodiments, the initial epitaxial layer 311 covers the first-type regions 300A and the second-type regions 300B. In some embodiments, the growth of the initial epitaxial layer 311 includes growing polycrystalline silicon in areas over the insulator layer 306 in the second-type regions 300B.

In some embodiments, an operation 201 is performed on the initial epitaxial layer 311 to transform the polycrystalline silicon into monocrystalline silicon. In some embodiments, the operation 201 on the initial epitaxial layer 311 includes an annealing operation, e.g., rapid thermal annealing. In some embodiments, the annealing operation is performed at a temperature between about 400° C. and about 600° C., between about 600° C. and about 800° C., between about 800° C. and about 1000° C. or between about 1000° C. and about 1200° C.

Referring to FIG. 3H, the epitaxial layer 312 is formed by continuing the epitaxial growth of the initial epitaxial layer 311. The epitaxial layer 312 is formed across the first-type regions 300A and the second-type regions 300B. The grown epitaxial layer 312 includes the initial epitaxial layer 311. In some embodiments, the growth of the epitaxial layer 312 includes monocrystalline silicon. The material, configuration and method of growing the epitaxial layer 312 is similar to those of growing the initial epitaxial layer 311. In some embodiments, the epitaxial layer 312 includes a resistivity less than the resistivity of the substrate 302. In some embodiments, the epitaxial layer 312 includes a resistivity less than about 500 Ω-cm, less than about 800 Ω-cm, or less than 1000 Ω-cm.

Referring to FIG. 3I, a planarization operation 203 is performed to planarize the surface of the grown epitaxial layer 312. The planarization operation 203 may include grinding, chemical mechanical planarization (CMP), laser etching, or the like. Through the planarization operation 203, the epitaxial layer 312 includes a substantially flat upper surface, in which the first-type regions 300A include a first thickness and the second-type regions 300B include a second thickness, in which the first thickness is greater than the second thickness. In some embodiments, the first thickness is greater than about 3000 angstrom, greater than about 4000 angstrom or greater than about 5000 angstrom, such as 4750 angstrom, and the second thickness is less than about 1500 angstrom, less than about 1000 angstrom, or less than about 800 angstrom and 1000 angstrom, such as 750 angstrom. As a result, the first-type regions 300A and the second-type regions are suitable for forming first-type devices and second-type devices, respectively. In some embodiments, a thickness ratio of the epitaxial layer 312 between the first-type region 300A and the second-type region 300B is greater than about 7.0, greater than about 9.0, greater than about 10.0 or greater than about 12.0 In some embodiments, a bottom surface of the epitaxial layer 312 in the first-type regions 300A is lower than a bottom surface of the epitaxial layer 312 in the second-type regions 300B.

FIG. 3J illustrates a formation of isolation regions 318 extending through the epitaxial layer 312. In some embodiments, the isolation regions 318 extend over and are aligned with the corresponding isolation regions 308. The isolation regions 318 may be used to define the first-type regions 300A and the second-type regions 300B in conjunction with the isolation regions 308. The material, configurations and method of forming of the isolation regions 318 are similar to those for the isolation regions 308, and thus these descriptions are omitted for brevity.

In some embodiments, each of the isolation regions 308 and 318 have sidewalls tapering from an upper surface of the insulator layer 306 to a bottom surface of the trap-rich layer 304. In some embodiments, the upper surface of the isolation region 308 has greater area than that of a bottom surface of the isolation region 318 directly over the corresponding isolation region 308. Thus, portions of the upper surface of the isolation region 308 are exposed. In such scenarios, a stacked isolation region is formed, in which the isolation region 308 and the isolation region 318 serve as a lower portion and an upper portion, respectively, of the stacked isolation region. A step or corner is formed at the interface between the trap-rich layer 304 and the insulator layer 306, or at the interface between the isolation region 308 and the isolation region 318. In some embodiments, due to the step between the isolation region 308 and the isolation region 318, portions of an upper surface of the isolation regions 308 contact the epitaxial layer 312.

In some embodiments where the trap-rich layer 304 is formed, the isolation region 308 is not formed in the insulator layer 306 and the trap-rich layer 304 subsequent to the deposition of the insulator layer 306. After the epitaxial layer 312 is formed, the isolation regions 318 are formed through the epitaxial layer 312, the insulator layer 306 and the trap-rich layer 304. In such scenarios, the isolation regions 318 includes straight sidewalls tapering from an upper surface of an upper surface of the epitaxial layer 312 to a bottom surface of the trap-rich layer 304.

As shown in FIG. 3K, doped regions 314 are formed within the epitaxial layer 312. An exemplary doped region 314A, referred to as a well region, is formed in the first-type region 300A, while an exemplary doped region 314B, referred to as a well region, is formed in the second-type region 300B. The doped regions 314A and 314B may be formed using ion implantation operations. The doped regions 314A and 314B may be implanted with n-type dopants, such as phosphorus, or arsenic or combinations thereof, or may be implanted with p-type dopants, such as boron or $BF_2$. In some embodiments, the dope region 314A includes a depth greater than a depth of the dope regions 314B for ensure the device performance of the first-type device in the first-type region 300A meet the design requirement. In some embodiments, a bottom surface 314S of the doped region 314A is lower than a bottom surface 314R of the doped region 314B. In some embodiments, the bottom surface 314S of the doped region 314A is lower than the bottom surface of the insulator layer 306. In some embodiments, the bottom surface 314S of the doped region 314A overlaps the trap-rich layer 304 horizontally.

Referring to FIG. 3L, a transistor layer 320 is formed over the epitaxial layer 312. In some embodiments, a first-type device 220A and a second-type device 220B are formed in the first-type region 300A and the second-type region 300B, respectively, of the transistor layer 320. In some embodiments, the first-type device 220A or the second-type device 220B is a field-effect transistor (FET) device, which can be implemented using a planar-type FET device, a fin-type FET device, a nanosheet FET device, a nanowire FET device, or other suitable FET technologies. The first-type device 220A may be a digital or analog device. The second-type device 220B may be a radio frequency device.

Each of the first-type device 220A or the second-type device 220B include dummy gate structure 210A or 210B over the epitaxial layer 312. Each of the dummy gate structures 210A and 210B includes a gate dielectric layer 202, a gate electrode layer 204 and a mask layer 206 arranged over one another.

The gate dielectric layer 202 may include oxide or high-k dielectric materials. In some embodiments, the gate electrode layer 204 includes polysilicon or metallic materials. In some embodiments, the mask layer 206 includes one or more dielectric layers, such as oxide, nitride, oxynitride, or the like. The gate dielectric layer 202, the gate electrode layer 204 and the mask layer 206 may be formed by depositing suitable materials in sequence using deposition method in a blanket manner, followed by a patterning operation to form the dummy gate structures 210.

Referring to FIG. 3M, gate spacers 322 are formed on sidewalls of each of the dummy gate structures 210. Gate spacers 322A are formed on sidewalls of the dummy gate structure 210A, while gate spacers 322B are formed on sidewalls of the dummy gate structure 210B. The gate spacers 322 may be formed of dielectric materials, such as oxide, nitride, oxynitride, carbide, a combination thereof, or the like.

Referring to FIG. 3N, doped regions 316 are formed within the epitaxial layer 312. An exemplary pair of doped regions 316A, also referred to as source/drain well regions for the dummy gate structure 210A, are formed in the doped regions 314A of the first-type region 300A, while an exemplary pair of doped regions 316B, also referred to as source/drain regions for the dummy gate structure 210B, are formed in the doped regions 314B of the second-type region 300B. In some embodiments, the doped regions 316 are formed using an ion implantation operation. The doped regions 316A and 316B may be implanted with n-type dopants, such as phosphorus, or arsenic or combinations thereof, or may be implanted with p-type dopants, such as boron or $BF_2$. The dope region 316A and 316B may be implanted using the isolation regions 318 and the gate spacers 322A and 322B as implantation masks.

Referring to FIG. 3O, a first interlayer dielectric (ILD) layer 328 is formed over the epitaxial layer 312. The first ILD layer 328 may laterally surround the dummy gate structure 210A and 210B. The first ILD layer 328 may be formed of oxide, such as un-doped silicate glass (USG), fluorinated silicate glass (FSG), silicon oxide, silicon nitride, silicon oxynitride, low-k dielectric materials, or the like. The low-k dielectric materials may have k values lower than 3.8, although the dielectric materials of the ILD layer 328 may also be close to 3.8. In some embodiments, the k values of the low-k dielectric materials are lower than about 3.0, and may be lower than about 2.5. The first ILD layer 328 may be formed using CVD, PVD, ALD, spinning coating, or other suitable deposition methods.

FIG. 3P shows a removal of the dummy gate structures 210 from the first ILD layer 328. Recesses 320R are left through the removal of the dummy gate structure 210. The removal of the dummy gate structures 210 may be performed using an etching operation, and may include a dry etch, a wet etch, an RIE, or the like.

Referring to FIG. 3Q, replacement gate structures 310 are formed in the respective recesses 320R in place of the respective dummy gate structures 210. Each of the replacement gate structures 310, including exemplary replacement gate structures 310A and 310B, may include a gate dielectric layer 212, a barrier layer 214, a work function adjustment layer 216 and a filling layer 218 arranged over one another.

The gate dielectric layer 212 may be formed of one or more dielectric materials, such as oxide, nitride, oxynitride, or high-k dielectric materials, such as $Al_2O_3$, $HfO_2$, $ZrO_2$, HfOxNy, ZrOxNy, HfSixOy, ZrSixOy, HfSixOVNz, ZrSixOyNz, $TiO_2$, $Ta_2O_5$, $La_2O_3$, $CeO_2$, $WO_3$, $Y_2O_3$, $LaAlO_3$, Ba1-xSrxTiO$_3$, PbTiO, BaTiO$_3$ (BTO), SrTiO$_3$ (STO), BaSrTiO$_3$ (BST), PbZrO$_3$, lead-strontium-titanate (PST), lead-zinc-niobate (PZN), lead-zirconate-titanate (PZT), lead-magnesium-niobium (PMN), yttria-stabilized zirconia (YSZ), ZnO/Ag/ZnO (ZAZ), a combination thereof, or the like.

In some embodiments, the barrier layer 214 includes refractory metals and their nitrides (e.g. TiN, TaN, $W_2N$, TiSiN, and TaSiN). In some embodiments, the work function adjustment layer 216 for an n-type FET device is formed of Ti, Ag, Al, TiAl, TiAlN, TiAlC, TaC, TaCN, TaSiN, TaAlC, Mn, Zr, a combination thereof, or the like. In some embodiments, the work function adjustment layer 216 for a p-type FET device is formed of TiN, WN, TaN, Ru, Co, a combination thereof, or the like. In some embodiments, the filling layer 218 include metallic materials, such as aluminum, tungsten, or the like.

The gate dielectric layer 212, the barrier layer 214, the work function adjustment layer 216 and the filling layer 218 may be formed using ALD, CVD, PVD, combinations thereof, or the like.

Referring to FIG. 3R, conductive vias 326 are formed in the first ILD layer 328. The contact vias 326 may be formed by initially etching vias through the first ILD layer 328 to expose the underlying doped regions 316 in the epitaxial layer 312, followed by deposition (by using CVD, PVD, ALD or other deposition methods) of conductive materials in the vias of the first ILD layer 328 to form the contact vias 326. The conductive vias 326 may include conductive materials, such as aluminum, gold, silver, copper, cobalt, tungsten, titanium, titanium nitride, tantalum, tantalum nitride, or other suitable materials. In some embodiments, conductive vias 326A are formed to be electrically coupled to the doped regions 316A, while conductive vias 326B are formed to be electrically coupled to the doped regions 316B.

In some embodiments, the conductive vias 326 may include a monolayer structure or a multilayer structure. In some embodiments, a metal silicide layer (not shown) is formed on each of the doped regions 316 prior to the formation of the conductive vias 326 to reduce contact resistance in the interface between the conductive vias 326 and their corresponding doped regions 316. The metal silicide layer may include titanium silicide, cobalt silicide, nickel silicide, platinum silicide, iridium silicide, erbium silicide, combination thereof, or the like.

Referring to FIG. 3S, a second ILD layer 338 of the transistor layer 320 is formed over the first ILD layer 328. The second ILD layer 338 may be formed of oxide, such as USG, FSG, silicon oxide, silicon nitride, silicon oxynitride, low-k dielectric materials, or the like. The second ILD layer 338 may be formed using CVD, PVD, ALD, spinning coating, or other suitable deposition methods.

Subsequently, conductive vias 336 are formed in the second ILD layer 338. The contact vias 336 may be formed by initially etching vias through the second ILD layer 338 to expose the underlying conductive vias 326, followed by deposition of conductive materials in the vias of the second ILD layer 338 to form the contact vias 336. The conductive vias 336 may include conductive materials, such as aluminum, gold, silver, copper, cobalt, tungsten, titanium, titanium nitride, tantalum, tantalum nitride, or other suitable materials. In some embodiments, conductive vias 336A are electrically coupled to the conductive vias 326A, conductive vias 336B are electrically coupled to the conductive vias 326B. Conductive vias 334A and 334B are electrically coupled to the replacement gate structures 310A and 310B, respectively.

Referring to FIG. 3T, an interconnect layer 340 is formed over the second ILD layer 338 of the transistor layer 320. In some embodiments, the interconnect layer 340 covers the transistor layer 320. In some embodiments, the interconnect layer 340 covers the first-type device 220A and the second-type device 220B. In some embodiments, the interconnect layer 340 covers the first-type regions 300A and the second-type regions 300B. The interconnect layer 340 is configured to electrically interconnect the conductive vias 336 or couple the conductive vias 336 to overlaying features. In some embodiments, the interconnect layer is configured to electrically couple first-type devices, e.g., the first-type device 220A, arranged in the first-type region 300A to second-type devices, e.g., the second-type device 220B, arranged in the second-type region 300B. The interconnect layer 340 may include an insulating layer 348 and multiple conductive layers 342, 344. The conductive layers 342, 344 are electrically insulated from each other and insulated from other features with the insulating layer 348. The insulating layer 348 may be formed of oxide, such as USG, FSG, silicon oxide, silicon nitride, silicon oxynitride, low-k dielectric materials, or the like.

Each of the conductive layers 342, 344 may include horizontally-extending conductive lines 342 and vertically-extending conductive vias 344, where the conductive lines 342 are electrically coupled to adjacent overlaying or underlying conductive lines 342 through at least one conductive via 344. The numbers and patterns of the conductive lines 342 and conductive vias 344 may be configured according to the design requirements of the semiconductor structure 300.

Referring to FIG. 3U, a first protection layer 352 and a second protection layer 354 are sequentially deposited over the interconnect layer 340. The first protection layer 352 and the second protection layer 354 may be collectively referred to as passivation layers. Each of the first protection layer 352 and the second protection layer 354 includes a dielectric material, such as silicon oxide, TEOS oxide, silicon nitride, combinations thereof, or the like. Alternatively, the first protection layer 352 and the second protection layer 354 may include USG, FSG, or other suitable dielectric materials. In some embodiments, the first protection layer 352 or the second protection layer 354 are formed by initially depositing a dielectric material over the interconnect layer 340, followed by photolithographic processes for patterning the dielectric material. Portions of bond pads in an uppermost layer of the interconnect layer 340 are then exposed. The deposition of the first protection layer 352 or the second protection layer 354 can be carried out using thermal oxidation, LPCVD (low-pressure CVD), PECVD (plasma-enhanced CVD) or the like.

Subsequently, a plurality of connectors 360 are formed over the second protection layer 354. Each of the connectors 360 may include an under bump metallization (UBM) layer 356, a metallization layer 358 and a conductive bump 359. As an example forming procedure, a mask layer (not shown) is formed over the second protection layer 354. The mask layer may include a dry film or a photoresist material. Alternatively, other materials, such as nitride, oxide, or oxynitride, may be used. Openings are formed by, for example, lithographic processes, to expose a portion of the first protection layer 352 and the second protection layer 354. The UBM layer 356 and the metallization layer 358 are sequentially formed in the openings of the mask layer.

In an embodiment, the UBM layer 356 may comprise a diffusion barrier layer and/or a seed layer over the diffusion barrier layer. In some embodiments, the diffusion barrier layer may include titanium, titanium nitride, tantalum, tantalum nitride, or the like. In some embodiments, the seed layer may comprise copper or other suitable materials. In some embodiments, the metallization layer 358 includes a monolayer or multilayer structure. For example, the metallization layer 358 comprises copper, cooper alloy, tin, nickel, nickel alloy, combinations thereof or the like. The UBM layer 356 and the metallization layer 358 may be formed by CVD, PVD, sputtering or other suitable methods.

A solder material is formed over the metallization layer 358 to form the conductive bump 359. In some embodiments, the solder material includes tin, lead, nickel, gold, silver, copper, combinations thereof, or mixtures of other electrically conductive material. In some embodiments, the solder material comprises lead-based materials, such as SnAg, SnPb, SnAgCu, or the like. In one embodiment, the solder material is a lead-free material.

Referring to FIG. 3V, the substrate 302 is thinned from a backside of the substrate 302. The thinning operation may include grinding, CMP, laser etching, or other suitable operations. In some embodiments, the substrate 302 is singulated or diced, e.g., by a dicing blade or a laser beam 170, to form individual semiconductor dies for further processing.

Figure 4A:
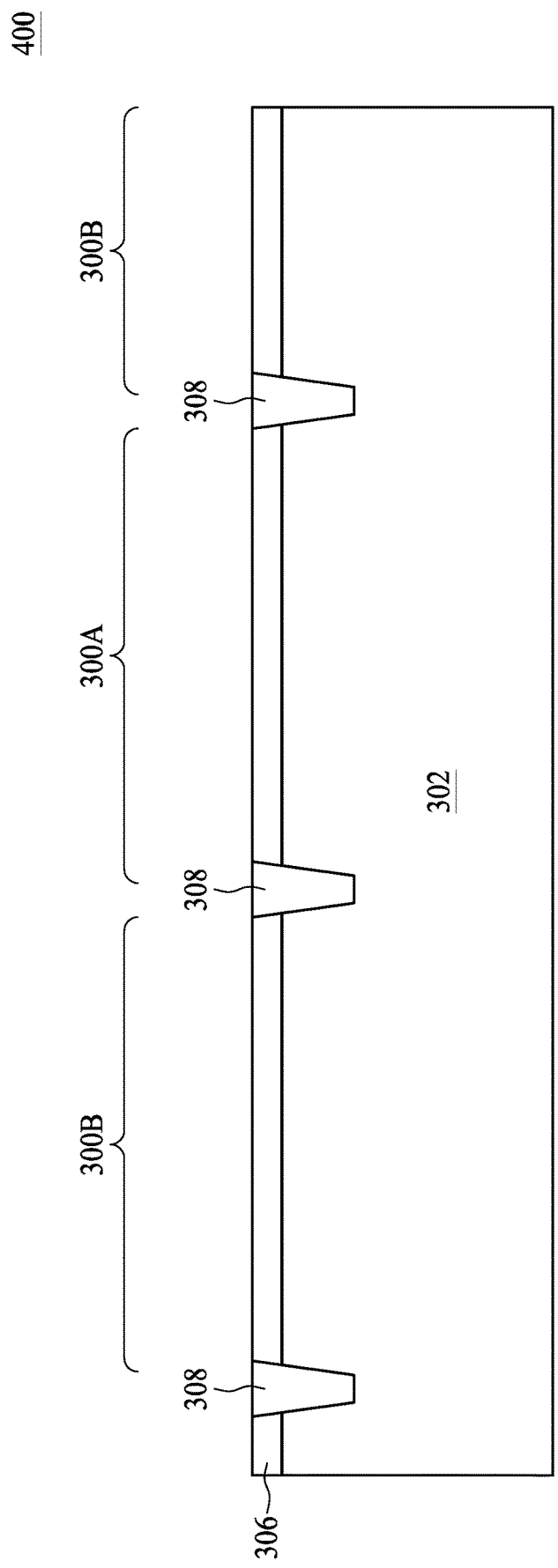
FIGS. 4A and 4B are cross-sectional views of intermediate stages of a method of manufacturing a semiconductor structure, in accordance with some embodiments.
Figure 4B:
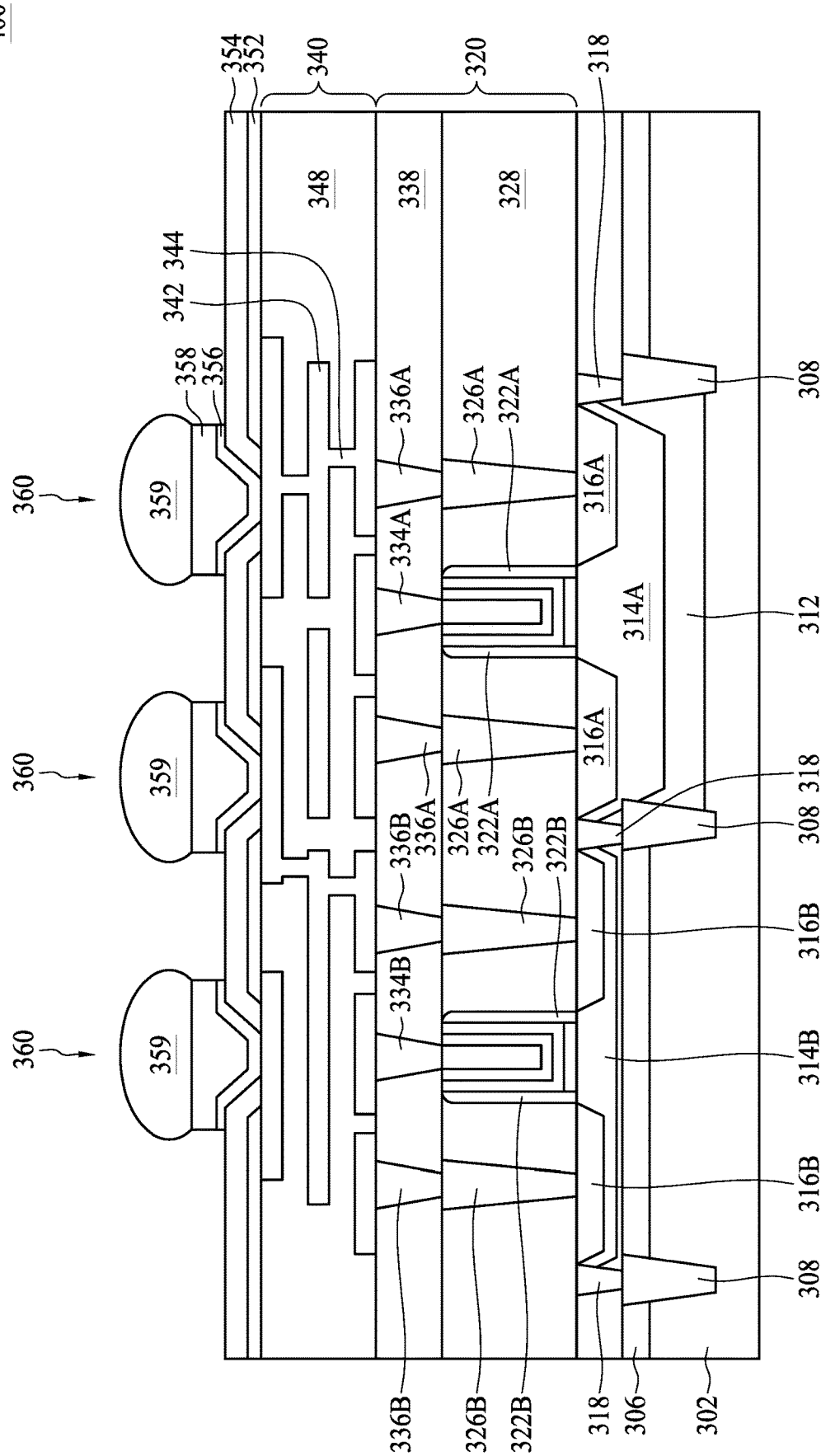

FIGS. 4A and 4B are cross-sectional views of intermediate stages of a method of manufacturing a semiconductor structure 400, in accordance with some embodiments. The method of manufacturing the semiconductor structure 400 is similar to that for manufacturing the semiconductor structure 300, and similar aspects are not repeated for brevity. Referring to FIG. 4A, the insulator layer 306 is formed directly over the substrate 302 in the absence of the trap-rich layer 304. The isolation regions 308 are then formed through the insulator layer 306 and extending to the substrate 302. The descriptions of forming the insulator layer 306 and the isolation regions 308 can be referred to FIGS. 3A, 3B and 3D. In some embodiments, the exposed upper surface of the first-type region 300A is lower than the bottom surface of the insulator layer 306. In some embodiments, the exposed upper surface of the first-type region 300A is higher than the bottom surface of the insulator layer 306.

Following the manufacturing stage shown in FIG. 4A, the manufacturing of the semiconductor structure 400 continues with the stages shown in FIGS. 3E to 3V. The resultant product of the semiconductor structure 400 is illustrated in FIG. 4B.

Figure 5:
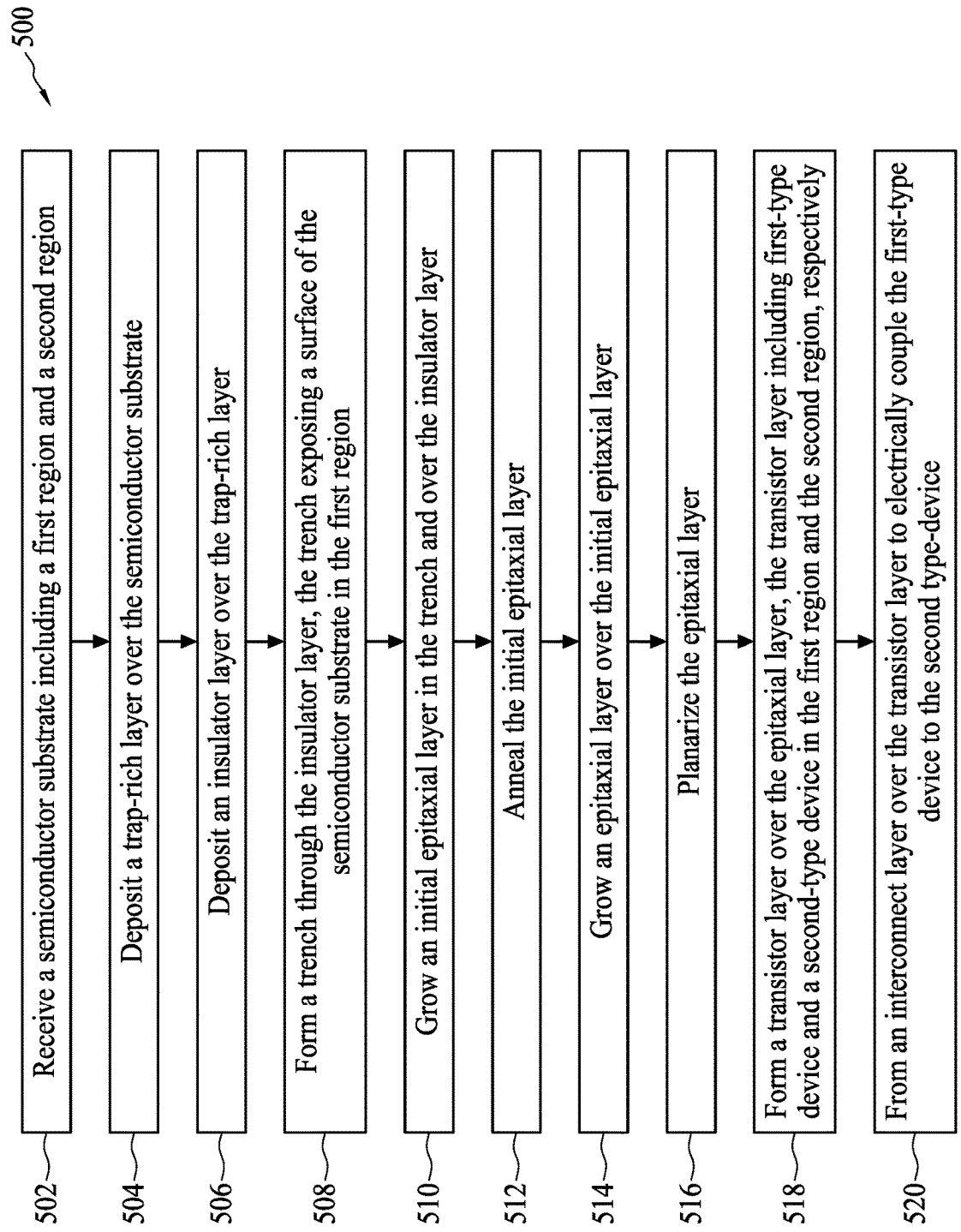
FIG. 5 is a flowchart of a method of manufacturing a semiconductor structure, in accordance with some embodiments.

FIG. 5 is a flowchart of a method 500 of manufacturing a semiconductor structure, in accordance with some embodiments. It should be understood that additional steps can be provided before, during, and after the steps shown in FIG. 5, and some of the steps described below can be replaced or eliminated in other embodiments of the method 500. The order of the steps may be interchangeable.

At step 502, a semiconductor substrate including a first region and a second region is received. At step 504, a trap-rich layer is optionally deposited over the semiconductor substrate. At step 506, an insulator layer is deposited over the trap-rich layer. In some embodiments, the insulator layer is deposited directly over the semiconductor substrate in the absence of the trap-rich layer.

At step 508, a trench is formed through the insulator layer, the trench exposing a surface of the semiconductor substrate in the first region. At step 510, an initial epitaxial layer is grown in the trench and over the insulator layer. At step 512, the initial epitaxial layer is annealed. At step 514, an epitaxial layer is grown over the initial epitaxial layer. At step 516, the epitaxial layer is planarized. At step 518, a transistor layer is formed over the epitaxial layer. The transistor layer includes a first-type device, e.g., a first transistor, and a second-type device, e.g., a second transistor, in the first region and the second region, respectively.

At stage 520, an interconnect layer is formed over the transistor layer to electrically couple the first-type device to the second type-device.

Figure 6A:
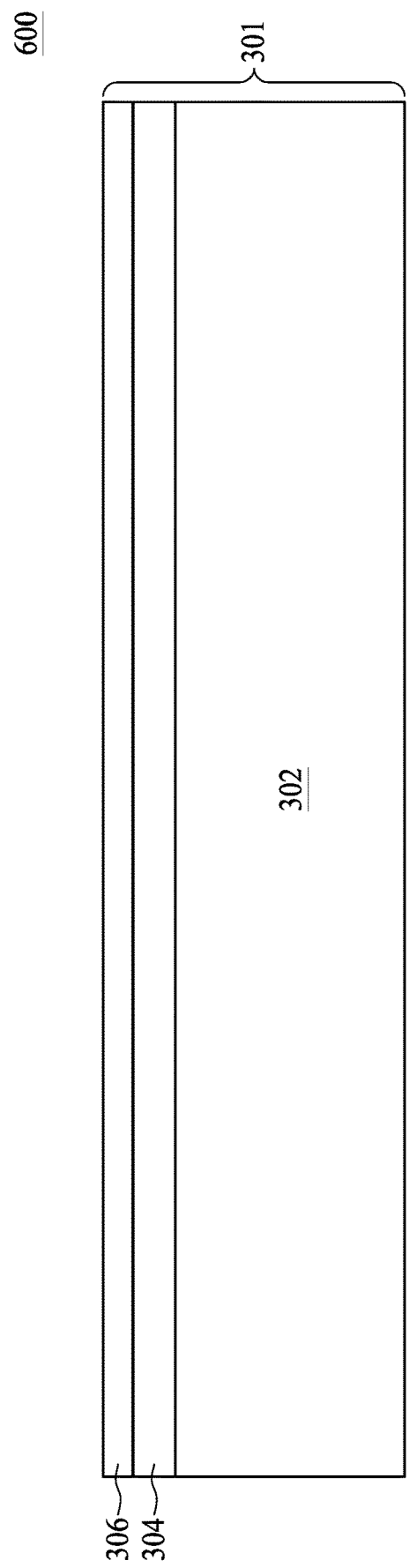
FIG. 6A to FIG. 6J are cross-sectional views of intermediate stages of a method of manufacturing a semiconductor structure, in accordance with some embodiments.

FIG. 6A to FIG. 6J are cross-sectional views of intermediate stages of a method of manufacturing a semiconductor structure 600, in accordance with some embodiments. The method of manufacturing the semiconductor structure 600 is similar to that of manufacturing the semiconductor structure 300, and these similar aspects are not repeated for brevity unless stated otherwise. Referring to FIG. 6A, the substrate 302 is provided. Subsequently, the trap-rich layer 304 and the insulator layer 306 are formed over the substrate 302 in succession. In some embodiments, a composite substrate 301 including the substrate 302, the trap-rich layer 304 and the insulator layer 306 is received. In some other embodiments, the composite substrate 301 including the substrate 302 and the insulator layer 306 (absent the trap-rich layer 304) is received.

Figure 6B:
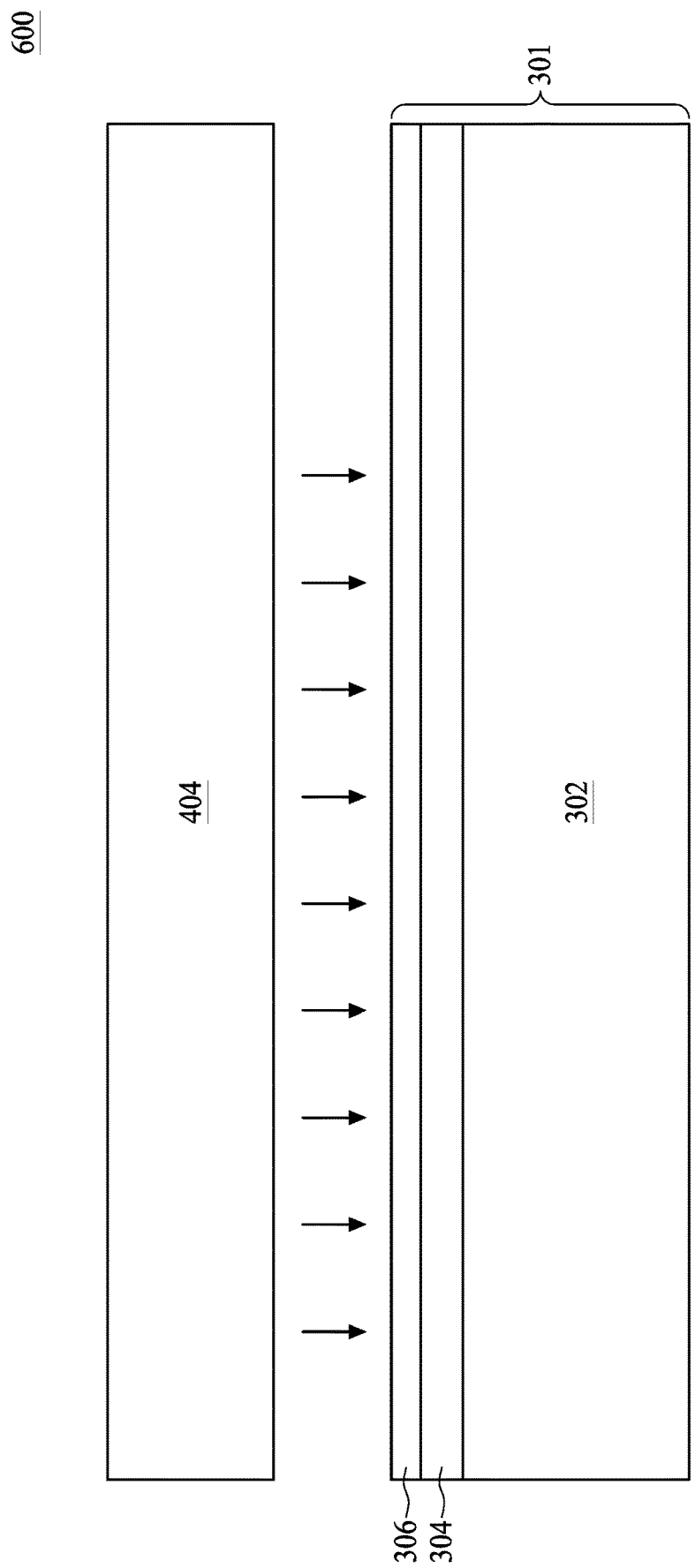

Referring to FIG. 6B, a silicon layer 404 is provided. The silicon layer 404 is bonded to the insulator layer 306 of the semiconductor structure 600. In some embodiments, the silicon layer 404 includes monocrystalline silicon. The silicon layer 404 may be bonded to the insulator layer 306 using fusion bonding, pressure bonding, thermal bonding, a combination therefore, or the like.

Figure 6C:
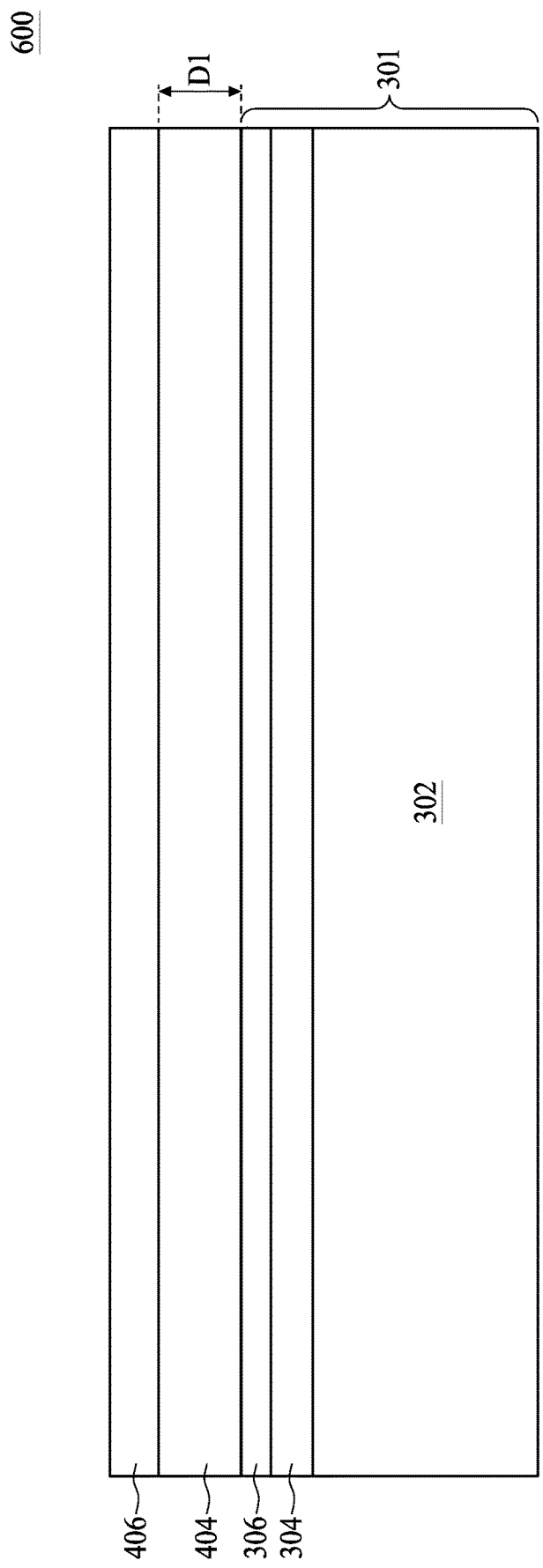

In some embodiments, the silicon layer 404 with a thickness D1 is formed on a carrier substrate (not separately shown). The carrier substrate may be formed of glass, ceramic, semiconductor materials, or the like. Subsequent to bonding the silicon layer 404 to the insulator layer 306, the carrier substrate is stripped or removed from the silicon layer 404. In some other embodiments, the silicon layer 404 is a bulk material and bonded to the insulator layer 306. Subsequent to the bonding of the silicon layer 404 to the insulator layer 306, the silicon layer 404 is thinned to the predetermined thickness D1 as illustrated in FIG. 6C. The thinning operation may include mechanical grinding, chemical mechanical polishing (CMP), plasma etching, or the like. The predetermined thickness D1 of the silicon layer 404 may be in a range between about 400 angstrom and about 3000 angstrom, between about 600 angstrom and about 2000 angstrom, between about 800 angstrom and about 1200 angstrom, such as 1000 angstrom.

Referring to FIG. 6C, once the silicon layer 404 is arranged over the insulator layer 306, a capping layer 406 is formed over the silicon layer 404. In some embodiments, the capping layer 406 includes a material different from the silicon layer 404. The capping layer 406 may include dielectric materials, such as silicon nitride, silicon oxide, silicon oxynitride, silicon carbide, or the like. In some embodiments, the capping layer 406 includes a thickness in a range between about 500 angstrom and about 4000 angstrom, between about 800 angstrom and about 3000 angstrom, between about 1000 angstrom and about 1200 angstrom, such as 1500 angstrom.

Figure 6D:
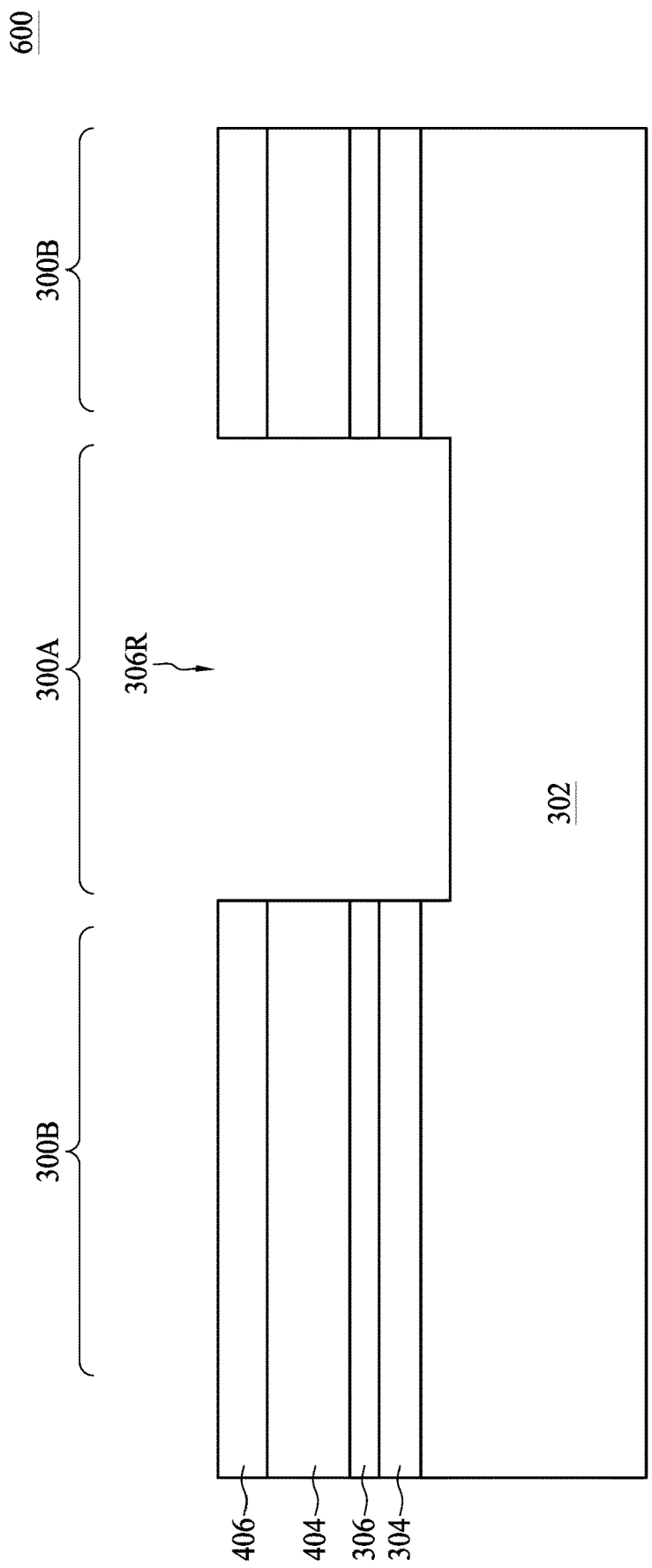

Referring to FIG. 6D, the semiconductor structure 600 is patterned, in which a trench 306R is formed in the first-type region 300A. The trench 306R is formed through the capping layer 406, the silicon layer 404, the insulator layer 306 and the trap-rich layer 304 (if present). In some embodiments, the trench 306R removes a depth of the substrate 302. The trench 306R may have a depth between about 5000 angstrom and about 8000 angstrom, e.g., 6500 angstrom. The method of etching the trench 306R shown in FIG. 6D is similar to that described with reference to FIG. 3E. In some embodiments, the semiconductor structure 600 is patterned in the absence of any isolation regions. In some embodiments, the bi-layer mask structure of the capping layer 406 and the patterned mask layer aids in providing better etching control of the trench 306R without damaging the underlying silicon layer 404.

Figure 6E:
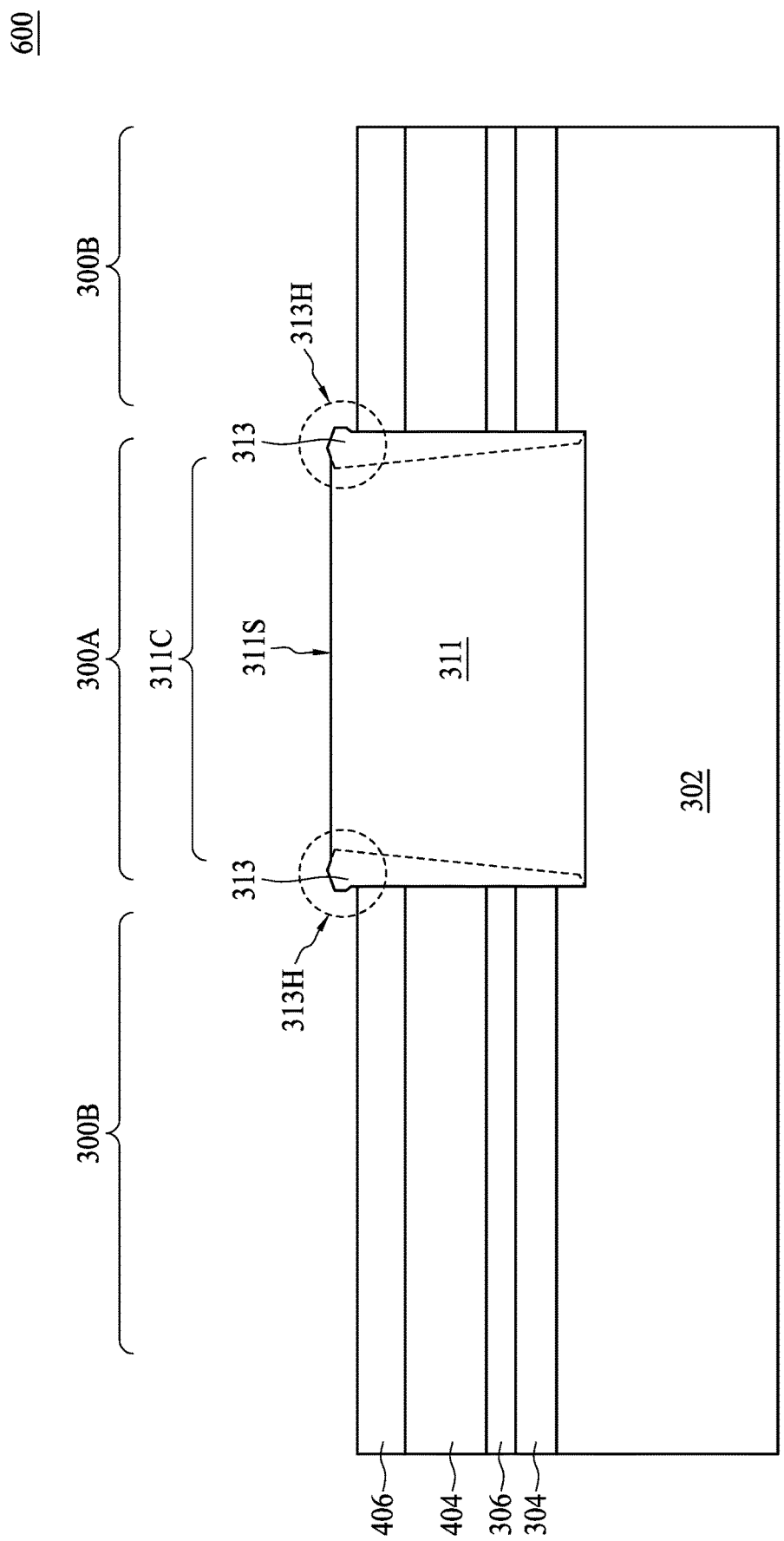

Referring to FIG. 6E, the initial epitaxial layer 311 is grown in the trench 306R from the exposed surface of the substrate 302. In some embodiments, the initial epitaxial layer 311 fills the trench 306R and is grown to a height greater than the upper surface of the capping layer 406. In some embodiments, the initial epitaxial layer 311 includes silicon. Since the initial epitaxial layer 311 is grown from the silicon-based substrate 302, a central region 311C of the initial epitaxial layer 311 away from the sidewalls of the trench 306R include monocrystalline silicon. The initial epitaxial layer 311 further includes peripheral regions 313 laterally surrounding the central region 311C of the initial epitaxial layer 311. The central region 311C and the peripheral region 313 of the initial epitaxial layer 311 may include silicon materials of different crystalline orientations. For example, the peripheral regions 313 of the initial epitaxial layer 311 may include polycrystalline silicon (polysilicon) at least due to the growth of the peripheral regions 313 on the non-silicon surfaces, e.g., the capping layer 406 and an insulator layer 306. In some embodiments, since the initial epitaxial layer 311 may include polycrystalline silicon in the peripheral region 313, the capping layer 406 prevents the initial epitaxial layer 311 from covering the silicon layer 404 formed of monocrystalline silicon.

In some embodiments, the peripheral region 313 tapers from the upper surface 311S of the initial epitaxial layer 311 to the bottom of the peripheral region 313 or the bottom surface of the initial epitaxial layer 311. As a result, the central region 311C of the initial epitaxial layer 311 that is formed of monocrystalline silicon has a cross-sectional shape having an upper surface (width) and a bottom surface (width), where the upper surface (width) is greater than the bottom surface (width). In some embodiments, the peripheral region 313 includes a hump or protrusion 313H extending at the top portion of the peripheral region 313. The protrusion 313H may have a top higher than the upper surface 311S of the central region 311C. In some embodiments, the peripheral regions 313 or the protrusions 313H include portions directly over the capping layer 406.

Figure 6F:
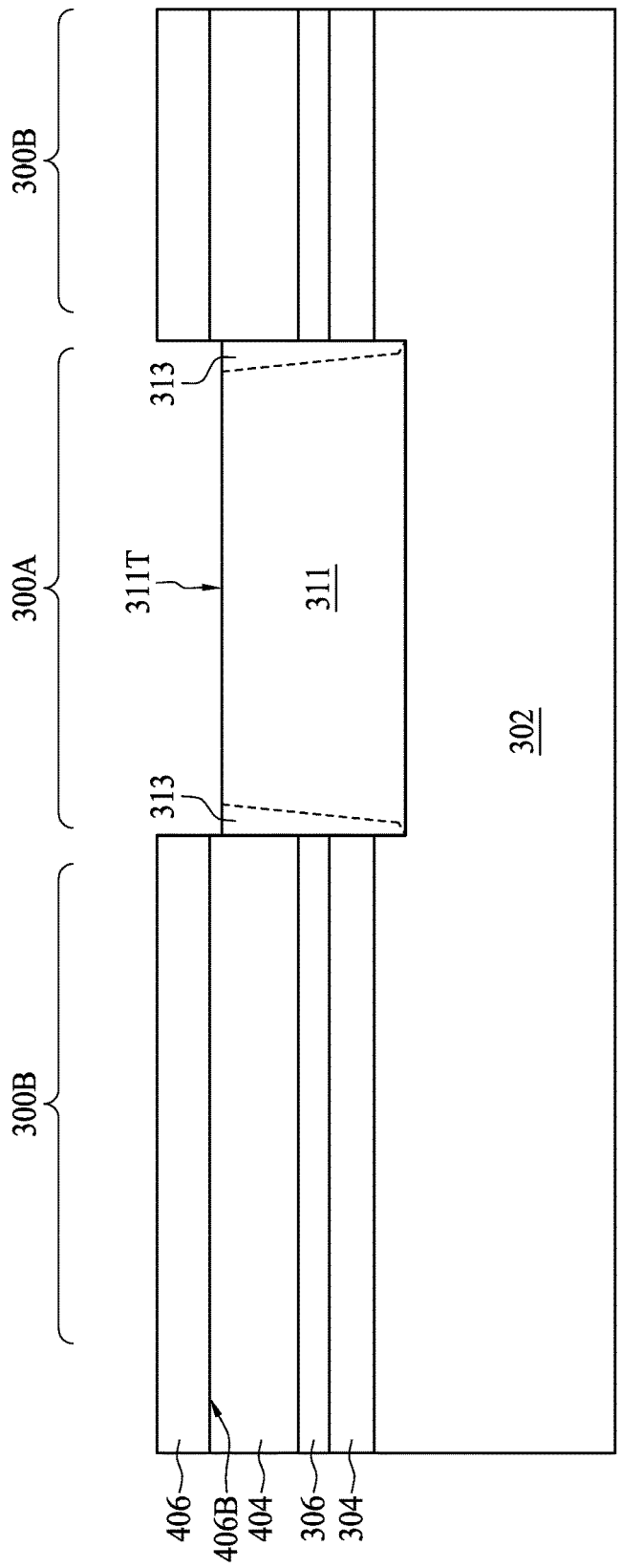

FIG. 6F illustrates an etching operation on the initial epitaxial layer 311. In some embodiments, a patterned mask layer (not separately shown) is formed over the capping layer 406. The patterned mask layer may be a photoresist layer or a bottom anti-reflection coating (BARC). The patterned mask layer is formed to cover the capping layer 406 and expose the initial epitaxial layer 311. The patterned mask layer may be formed by depositing a blanket photoresist or BARC material over the capping layer 406, followed by a patterning operation to expose the initial epitaxial layer 311. In some embodiments, the patterned mask layer has a thickness greater than about 4000 angstrom, greater than 5000 angstrom, or greater than 6000 angstrom.

Subsequently, the etching operation is performed to remove a thickness of the initial epitaxial layer 311. The etching operation may include a dry etch, a wet etch, an RIE, or the like. Through the etching operation, the initial epitaxial layer 311 is thinned to an upper surface 311T lower than the bottom surface 406B of the capping layer 406. In some embodiments, the capping layer 406 is kept substantially intact during the etching operation. In some other embodiments, a thickness of the patterned mask layer is etched during the etching operation. The patterned mask layer may not be completely removed during the etching operation in order to protect the underlying capping layer 406. In some embodiments, a sidewall of the silicon layer 404 exposed to the trench 306R is etched during the etching operation. In some embodiments, after the etching operation is completed, the patterned mask layer is removed or stripped.

Figure 6G:
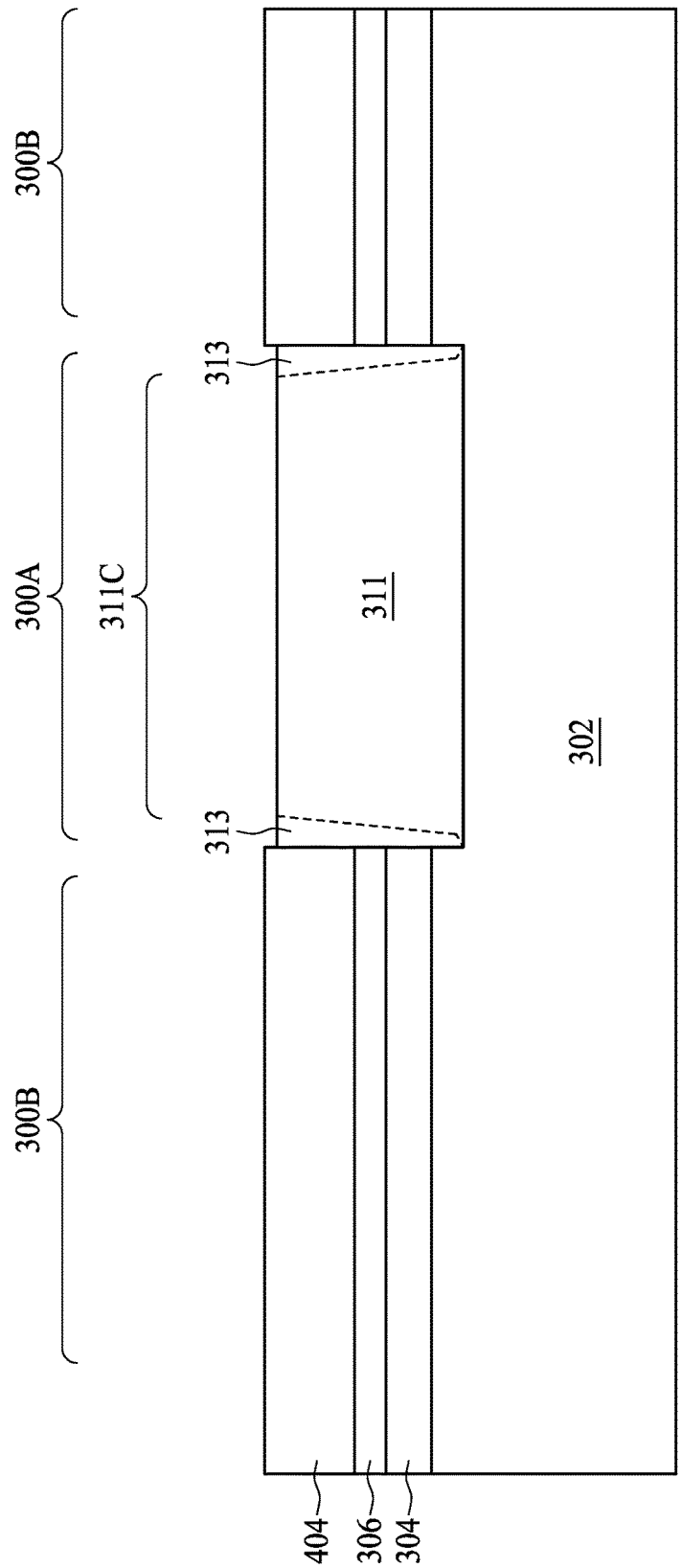

Referring to FIG. 6G, the capping layer 406 is removed. The removal of the capping layer 406 may be performed by a dry etch, a wet etch, an RIE, or the like. The upper surface of the silicon layer 404 is thus exposed.

Figure 6H:
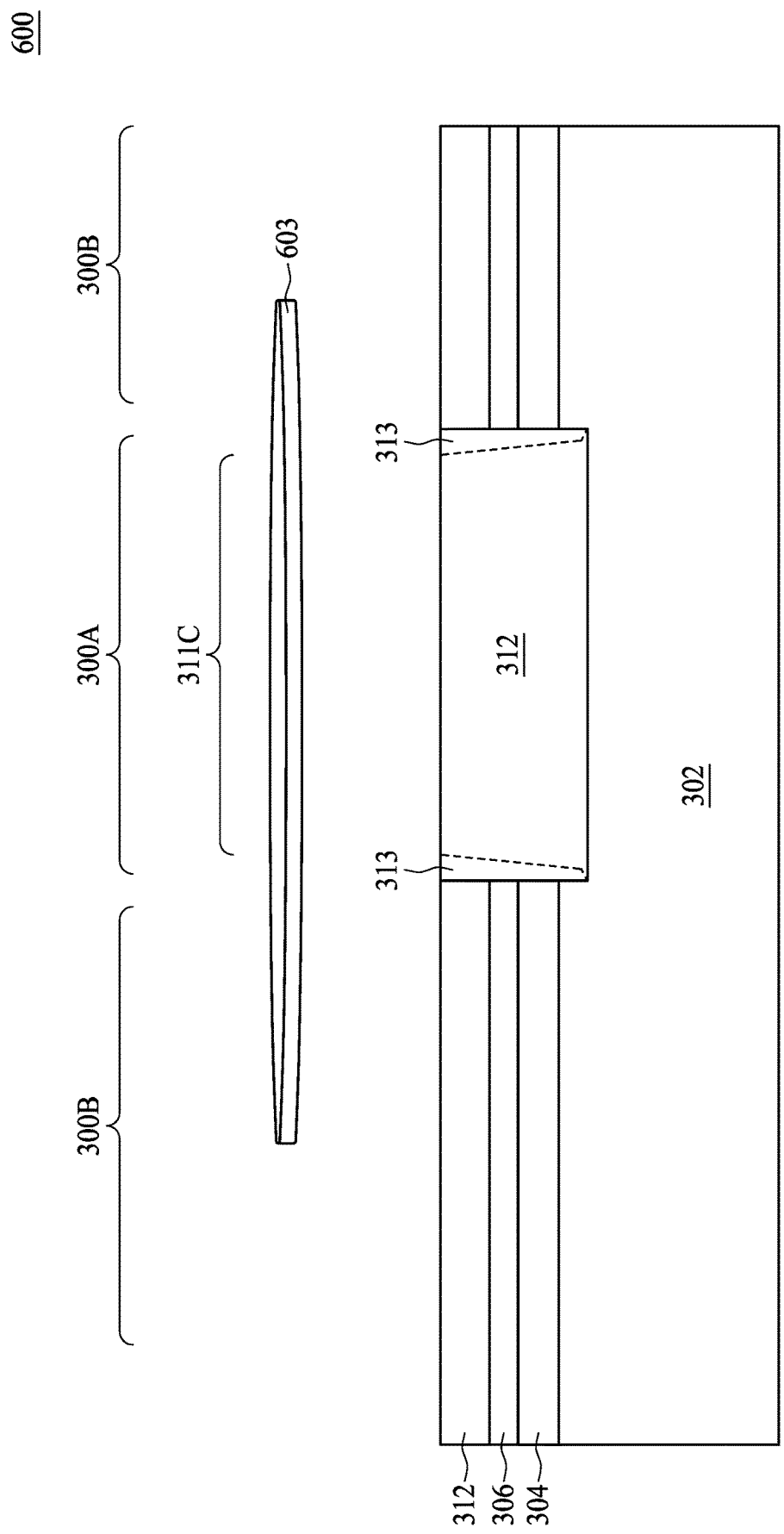

Referring to FIG. 6H, a planarization operation 603 is performed to level the upper surface of the silicon layer 404 with the upper surface of the initial epitaxial layer 311. As a result, a thickness of the initial epitaxial layer and a thickness of the silicon layer 404 are removed during the planarization operation 603 to form the epitaxial layer 312 with a substantially flat surface. In some embodiments, the planarization operation 603 includes mechanical grinding, CMP, plasma etching, or the like.

Figure 6I:
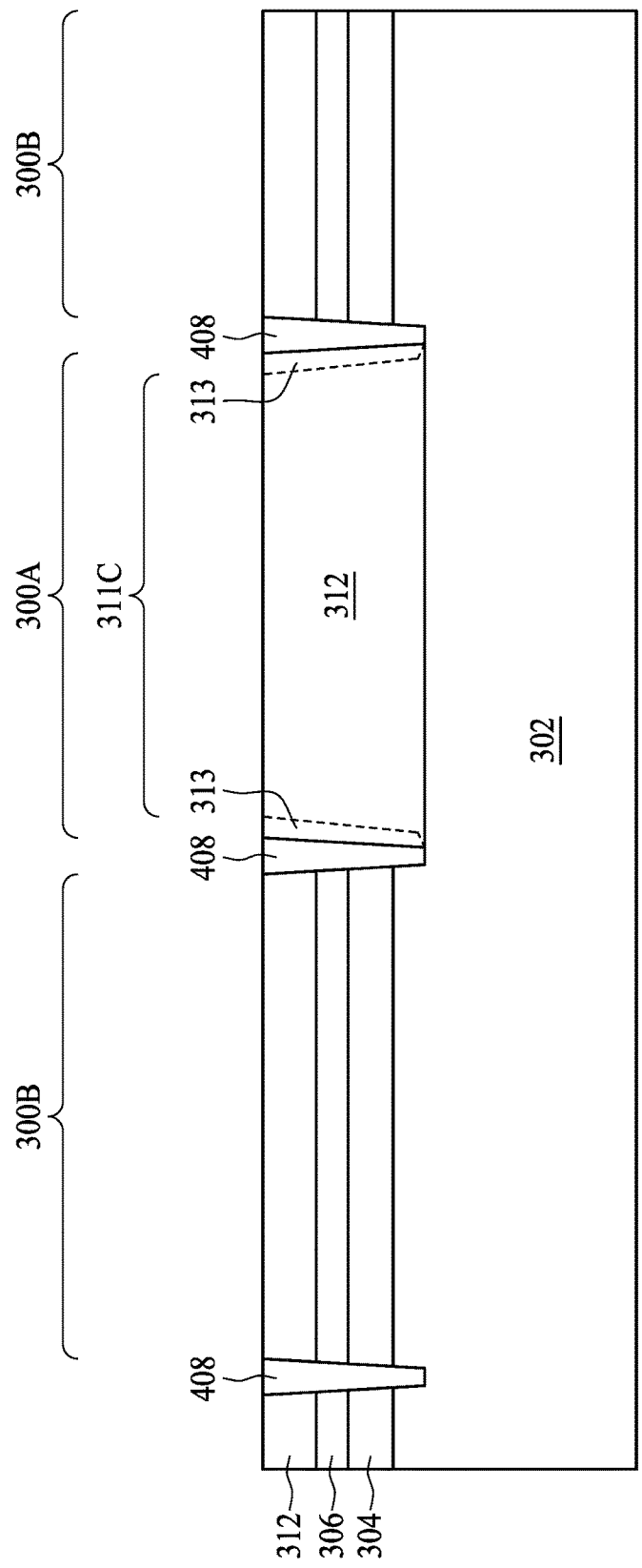

FIG. 6I illustrates the formation of the isolation regions 408. The materials, forming method are similar to those of forming the isolation region 308 or 318. In some embodiments, the isolation regions 408 extend through the epitaxial layer 312, the insulator layer 306 and the trap-rich layer 304. In some embodiments, the isolation regions 408 define the boundaries between the first-type regions 300A and the second-type regions 300B. In some embodiments, parts of the peripheral regions 313 are removed during the formation of the isolation regions 408. Trenches for the isolation regions 408 may be etched, whereby the peripheral regions 313 are removed. In some embodiments, parts of the peripheral regions 313 are left on sidewalls of the isolation regions 408. In some cases, the entire peripheral regions 313 are removed during the formation of the isolation regions 408, and thus the monocrystalline area (previously formed initial epitaxial layer 311) is in contact with the isolation regions 408.

Figure 6J:
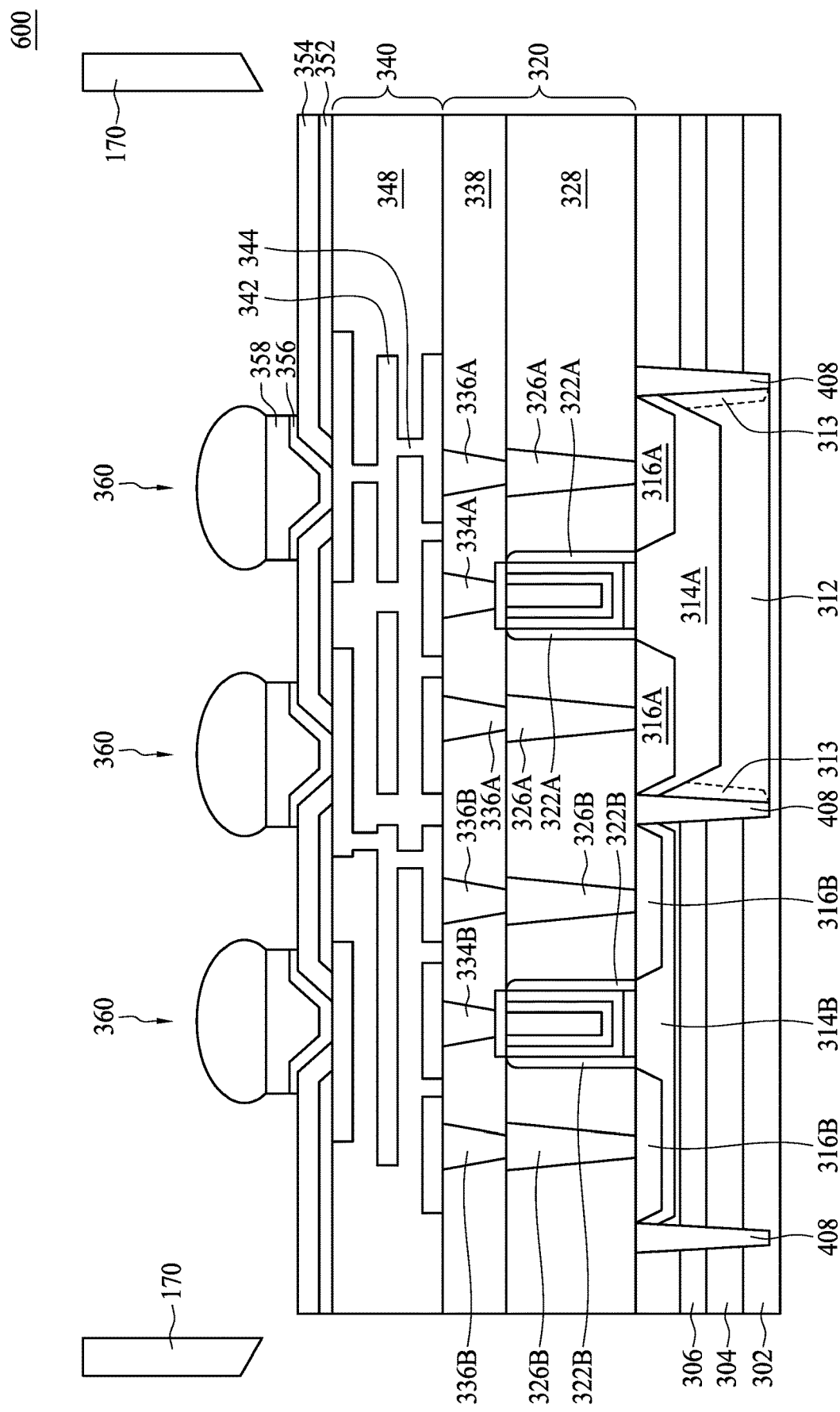

Referring to FIG. 6J, the transistor layer 320, the interconnect layer 340, the first protection layer 352, the second protection layer 354, the UBM layer 356, the metallization layer 358 and the connectors 360 are subsequently formed. The materials, configurations and methods of forming of the aforesaid features are similar to those described with reference to FIG. 3K to FIG. 3V, and these descriptions are not repeated for brevity. The substrate 302 is singulated or diced, e.g., by a dicing blade or a laser beam 170, to form individual semiconductor dies for further processing.

In embodiments where the peripheral regions 313 are entirely removed during the formation of the isolation regions 408, the doped region 314A or 316A in the first-type region 300A are spaced apart from the peripheral region 313. In some examples, the entirety of the doped region 314A or 316A are formed within the area of monocrystalline silicon in the central region 311C.

Figure 7:
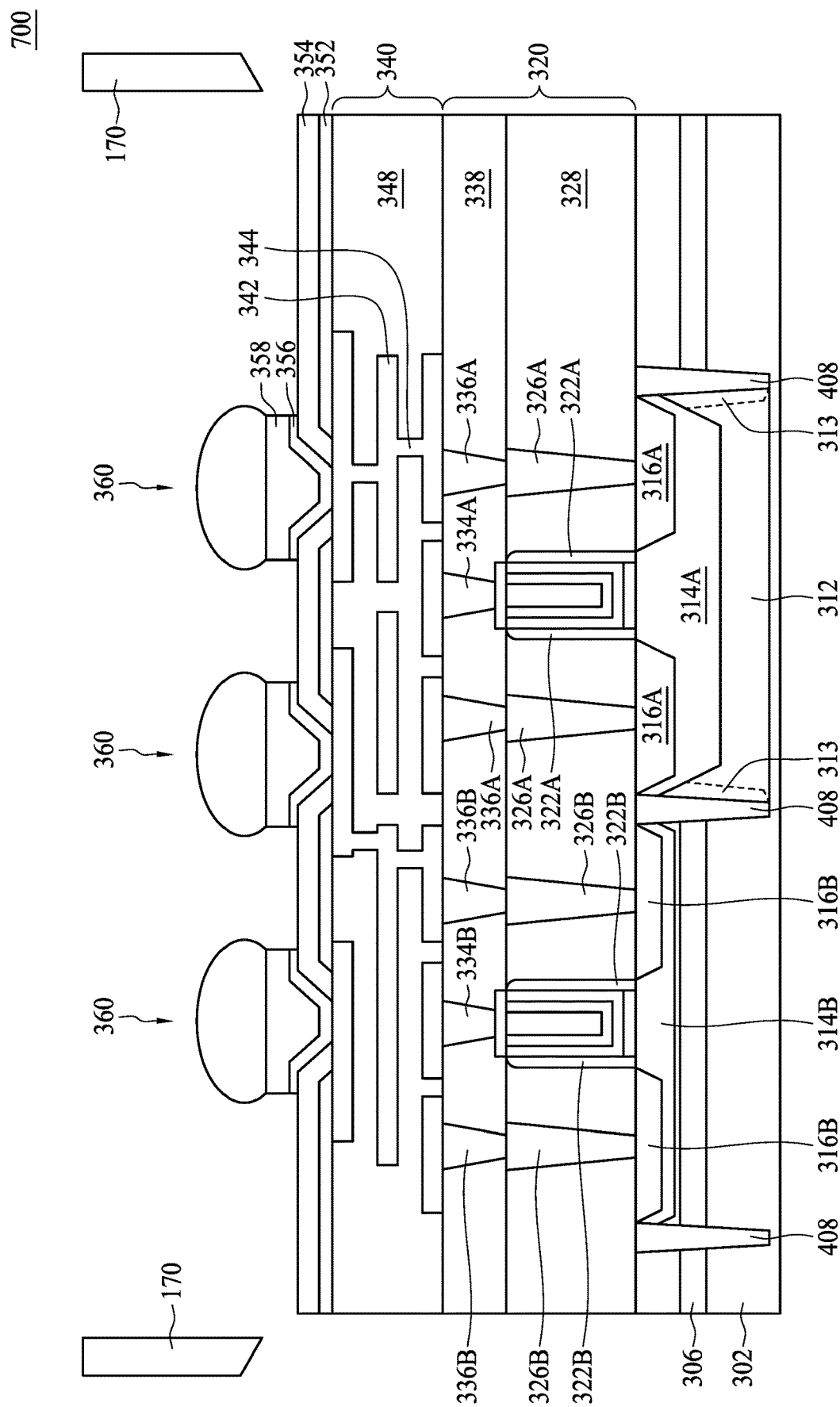
FIG. 7 is a cross-sectional view of a semiconductor structure, in accordance with some embodiments.

FIG. 7 is a cross-sectional view of a semiconductor structure, in accordance with some embodiments. The method of manufacturing the semiconductor structure 700 is similar to that for manufacturing the semiconductor structure 600, and these similar aspects are not repeated for brevity. Referring to FIG. 7, the insulator layer 306 is formed directly over the substrate 302 in the absence of the trap-rich layer 304. In some embodiments, the exposed upper surface of the first-type region 300A is lower than the bottom surface of the insulator layer 306. In some embodiments, the exposed upper surface of the first-type region 300A is higher than the bottom surface of the insulator layer 306.

Figure 8:
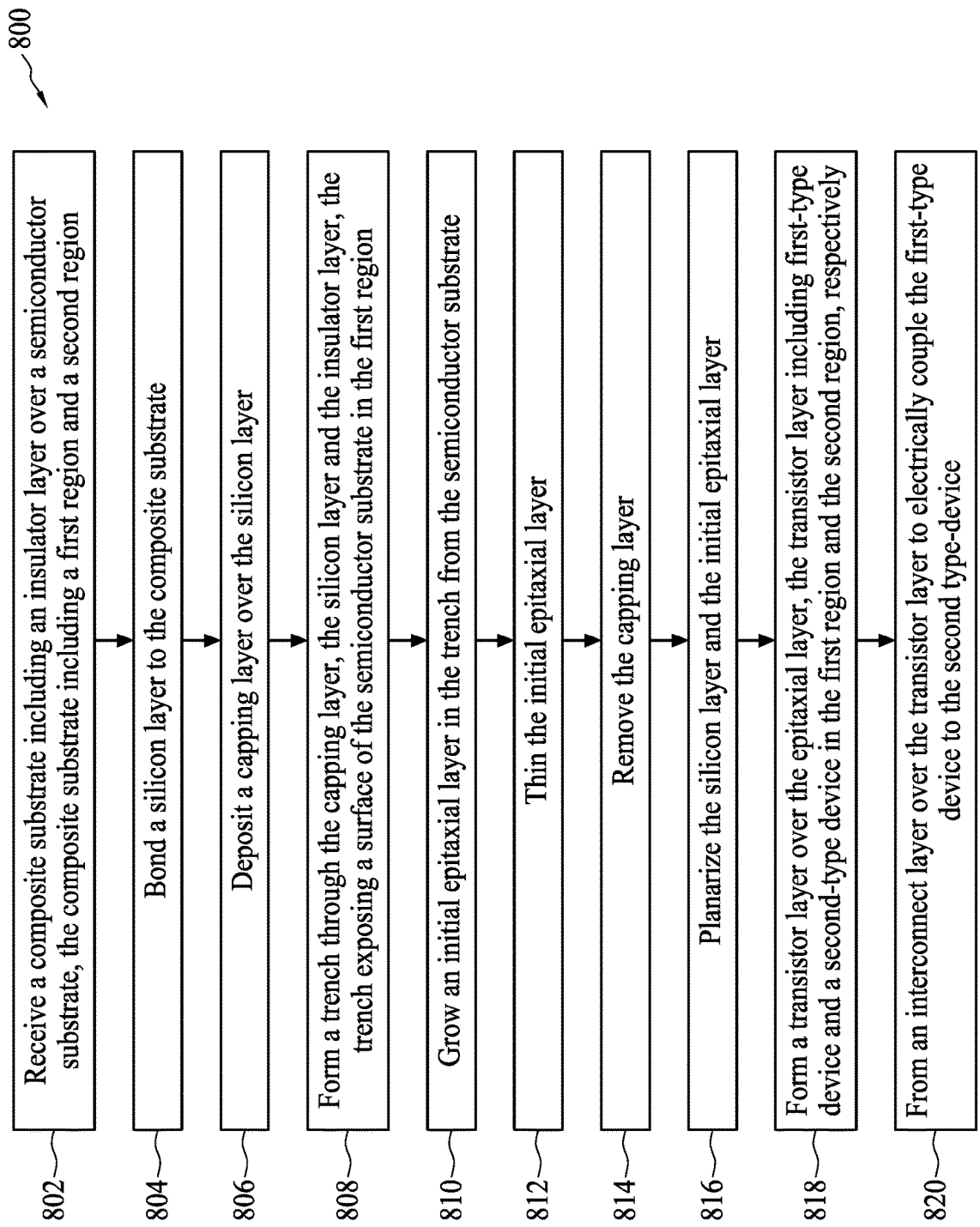
FIG. 8 is a flowchart of a method of manufacturing a semiconductor structure, in accordance with some embodiments.

FIG. 8 is a flowchart of a method 800 of manufacturing a semiconductor structure, in accordance with some embodiments. It should be understood that additional steps can be provided before, during, and after the steps shown in FIG. 8, and some of the steps described below can be replaced or eliminated in other embodiments of the method 800. The order of the steps may be interchangeable.

At step 802, a composite substrate is received, where the composite substrate includes a semiconductor substrate and an insulator layer over the semiconductor substrate. In some embodiments, the composite substrate further includes a trap-rich layer between the semiconductor substrate and the insulator layer. The composite substrate includes a first region and a second region. At step 804, a silicon layer is bonded to the composite substrate. At step 806, a capping layer is deposited over the silicon layer. In some embodiments, the capping layer is deposited directly over the silicon in the absence of the trap-rich layer.

At step 808, a trench is formed through the capping layer, the silicon layer and the insulator layer. The trench exposes a surface of a semiconductor substrate in the first region. At step 810, an initial epitaxial layer is grown in the trench from the semiconductor substrate. At step 812, the initial epitaxial layer is thinned or etched. Through the thinning operation, the initial epitaxial layer has an upper surface lower than the bottom surface of the capping layer. At step 814, the capping layer is removed. At step 816, the silicon layer and the epitaxial layer are planarized. In some embodiment, the upper surface of the silicon layer is level with the upper surface of the epitaxial layer through the planarization.

At step 818, a transistor layer is formed over the epitaxial layer. The transistor layer includes a first-type device, e.g., a first transistor, and a second-type device, e.g., a second transistor, in the first region and the second region, respectively. At stage 820, an interconnect layer is formed over the transistor layer to electrically couple the first-type device to the second type-device.

Some embodiments of the present disclosure include a method. The method includes: receiving a composite substrate including a first region and a second region, the composite substrate comprising a semiconductor substrate and an insulator layer over the semiconductor substrate; bonding a silicon layer to the composite substrate; depositing a capping layer over the silicon layer; forming a trench through the capping layer, the silicon layer and the insulator layer, the trench exposing a surface of the semiconductor substrate in the first region; growing an initial epitaxial layer in the trench; removing the capping layer to form an epitaxial layer from the silicon layer and the initial epitaxial layer; forming a transistor layer over the epitaxial layer, the transistor layer including a first transistor and a second transistor in the first region and the second region, respectively; and forming an interconnect layer over the transistor layer and electrically coupling the first transistor to the second transistor.

Some embodiments of the present disclosure include a method. The method includes: receiving a composite substrate including a first region and a second region, the composite substrate comprising a semiconductor substrate and an insulator layer over the semiconductor substrate; bonding a silicon layer to the composite substrate; depositing a capping layer over the silicon layer; forming a trench in the first region through the capping layer, the silicon layer and the insulator layer; growing an initial epitaxial layer to fill the trench, the initial epitaxial layer including an upper surface higher than an upper surface of the capping layer; thinning the initial epitaxial layer to cause the upper surface of the initial epitaxial layer to be lower than the capping layer; causing the upper surface of the initial epitaxial layer to be level with an upper surface of the silicon layer; forming a first transistor and a second transistor over the first region and the second region, respectively; and forming an interconnect layer to cover the first transistor and the second transistor, the interconnect layer electrically coupling the first transistor to the second transistor.

Some embodiments of the present disclosure include semiconductor structure including a semiconductor substrate. The semiconductor substrates includes a first region and a second region. The semiconductor also includes an insulator layer in the second region over the semiconductor substrate, an epitaxial layer extending over the insulator layer across the first region and the second region, where the epitaxial layer includes a first bottom surface in the first region lower than a second bottom surface in the second region, where the epitaxial layer includes a central region and a peripheral region laterally surrounding the central region, and the central region and the peripheral region includes different crystalline orientations. The semiconductor structure further includes an isolation region between the first region and the second region, a transistor layer over the epitaxial layer, the transistor layer including a first transistor and a second transistor in the first region and the second region, respectively, and an interconnect layer over the transistor layer, the interconnect layer electrically coupling the first transistor to the second transistor.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a composite substrate including a first region and a second region, the composite substrate comprising a semiconductor substrate and an insulator layer over the semiconductor substrate;
   bonding a silicon layer to the composite substrate;
   depositing a capping layer over the silicon layer;
   forming a trench through the capping layer, the silicon layer and the insulator layer, the trench exposing a surface of the semiconductor substrate in the first region;
   growing an initial epitaxial layer in direct contact with a sidewall of the silicon layer in the trench;
   removing the capping layer to form an epitaxial layer from the silicon layer and the initial epitaxial layer;
   forming a transistor layer over the epitaxial layer, the transistor layer including a first transistor and a second transistor in the first region and the second region, respectively; and
   forming an interconnect layer over the transistor layer and electrically coupling the first transistor to the second transistor.

2. The method of claim 1, wherein the semiconductor substrate has a resistivity between about 1000 Ω-cm and about 18000 Ω-cm.

3. The method of claim 1, wherein the growing of the initial epitaxial layer includes growing monocrystalline silicon in a central region of the initial epitaxial layer and polycrystalline silicon in a peripheral region of the initial epitaxial layer.

4. The method of claim 3, wherein the peripheral region includes a protrusion, wherein the protrusion has a top higher than an upper surface of the central region of the initial epitaxial layer.

5. The method of claim 4, wherein the protrusion extends to be directly over the capping layer.

6. The method of claim 1, further comprising thinning the initial epitaxial layer prior to removing the capping layer.

7. The method of claim 6, wherein the epitaxial layer has an upper surface lower than a bottom surface of the capping layer through the thinning.

8. The method of claim 1, wherein the removing of the capping layer to form the epitaxial layer comprises performing a planarization operation to reduce a thickness of the silicon layer and a thickness of the initial epitaxial layer.

9. The method of claim 1, further comprising depositing a trap-rich layer over the semiconductor substrate, wherein the insulator layer is arranged over the trap-rich layer.

10. The method of claim 1, further comprising forming a first doped region and a second doped region in the first region and the second region, respectively, the first doped region has a bottom surface lower than a bottom surface of the insulator layer.

11. A method, comprising:
receiving a composite substrate including a first region and a second region, the composite substrate comprising a semiconductor substrate and an insulator layer over the semiconductor substrate;
bonding a silicon layer to the composite substrate;
depositing a capping layer over the silicon layer;
forming a trench in the first region through the capping layer, the silicon layer and the insulator layer;
growing an initial epitaxial layer to fill the trench, the initial epitaxial layer including an upper surface higher than an upper surface of the capping layer;
thinning the initial epitaxial layer to cause the upper surface of the initial epitaxial layer to be lower than the capping layer;
causing the upper surface of the initial epitaxial layer to be level with an upper surface of the silicon layer;
forming a first transistor and a second transistor over the first region and the second region, respectively; and
forming an interconnect layer to cover the first transistor and the second transistor, the interconnect layer electrically coupling the first transistor to the second transistor.

12. The method of claim 11, further comprising etching the capping layer subsequent to the thinning of the initial epitaxial layer.

13. The method of claim 11, further comprising planarizing the initial epitaxial layer prior to the forming of the first transistor and the second transistor.

14. The method of claim 11, wherein the forming of the first and second transistors comprises:
forming first and second dummy gate structures over the first region and the second region, respectively;
forming gate spacers on sidewalls of the first and second dummy gate structures, respectively; and
forming first and second replacement gate structures in place of the first and second dummy gate structures, respectively.

15. The method of claim 11, further comprising forming an isolation region through the initial epitaxial layer subsequent to the causing of the upper surface of the initial epitaxial layer to be level with the upper surface of the silicon layer.

16. The method of claim 15, wherein the initial epitaxial layer includes a region of polycrystalline silicon in contact with the isolation region.

17. A semiconductor structure, comprising:
a semiconductor substrate comprising silicon and including a first region and a second region;
an insulator layer in the second region over the semiconductor substrate;
an epitaxial layer extending over the insulator layer across the first region and the second region, the epitaxial layer includes a first bottom surface in the first region lower than a second bottom surface in the second region, wherein the epitaxial layer includes a central region and a peripheral region laterally surrounding the central region, the central region and the peripheral region comprising different crystalline orientations;
an isolation region between the first region and the second region;
a transistor layer over the epitaxial layer, the transistor layer including a first transistor and a second transistor in the first region and the second region, respectively;
a trap-rich layer in the second region between the insulator layer and the semiconductor substrate, wherein the trap-rich layer comprises undoped polycrystalline silicon or amorphous silicon;
a first doped region and a second doped region in the first region and the second region, respectively, in the epitaxial layer;
a first source/drain region and a second source/drain region arranged within the second doped region, wherein the second doped region has a bottom surface separated from an upper surface of the insulator layer; and
an interconnect layer over the transistor layer, the interconnect layer electrically coupling the first transistor to the second transistor.

18. The semiconductor structure of claim 17, wherein the first doped region has a bottom surface lower than a bottom surface of the insulator layer.

19. The semiconductor structure of claim 17, wherein the second doped region is between the insulator layer and each of the first source/drain region and the second source/drain region, and has a bottom surface separated from a bottom surface of the first and second source/drain regions.

20. The semiconductor structure of claim 17, wherein the central region includes monocrystalline silicon and the peripheral region includes polycrystalline silicon.

* * * * *